United States Patent
Okamoto

(10) Patent No.: US 8,372,704 B2
(45) Date of Patent: Feb. 12, 2013

(54) SEMICONDUCTOR INTEGRATED DEVICE AND MANUFACTURING METHOD FOR THE SAME

(75) Inventor: Hitoshi Okamoto, Kanagawa (JP)

(73) Assignee: Renesas Electronics Corporation, Kawasaki-Shi Kanagawa (JP)

( * ) Notice: Subject to any disclaimer, the term of this patent is extended or adjusted under 35 U.S.C. 154(b) by 0 days.

(21) Appl. No.: 12/929,870

(22) Filed: Feb. 22, 2011

(65) Prior Publication Data

US 2011/0143523 A1 Jun. 16, 2011

Related U.S. Application Data

(62) Division of application No. 12/314,011, filed on Dec. 2, 2008, now Pat. No. 8,129,793.

(30) Foreign Application Priority Data

Dec. 4, 2007 (JP) .................................. 2007-313113
Nov. 21, 2008 (JP) .................................. 2008-298144

(51) Int. Cl.
*H01L 21/04* (2006.01)

(52) U.S. Cl. ........ 438/199; 438/233; 438/224; 257/369; 257/371

(58) Field of Classification Search .................. 438/199, 438/223–224; 257/369, 371
See application file for complete search history.

(56) References Cited

U.S. PATENT DOCUMENTS

| | | | | |
|---|---|---|---|---|
| 6,664,608 B1 * | 12/2003 | Burr | .............................. | 257/549 |
| 7,598,573 B2 * | 10/2009 | Masleid | ........................ | 257/369 |
| 2004/0108520 A1 * | 6/2004 | Furumiya et al. | ............. | 257/200 |
| 2006/0267103 A1 | 11/2006 | Tanaka | | |

FOREIGN PATENT DOCUMENTS

JP 2007-5763 1/2007

* cited by examiner

*Primary Examiner* — Eugene Lee
(74) *Attorney, Agent, or Firm* — McGinn IP Law Group, PLLC

(57) ABSTRACT

A manufacturing method for a semiconductor integrated device including forming a second impurity layer of a second conductivity type that is higher in impurity concentration than a second well of the second conductivity type on a first impurity layer of a first conductivity type that is higher in impurity concentration than a first well of the first conductivity type, forming the first well of the first conductivity type on the second impurity layer of the second conductivity type on the first impurity layer of the first conductivity type, the first well being supplied with potential from the first impurity layer of the first conductivity type, and forming the second well of the second conductivity type on the second impurity layer of the second conductivity type on the first impurity layer of the first conductivity type, the second well being supplied with potential from the second impurity layer of the second conductivity type.

10 Claims, 22 Drawing Sheets

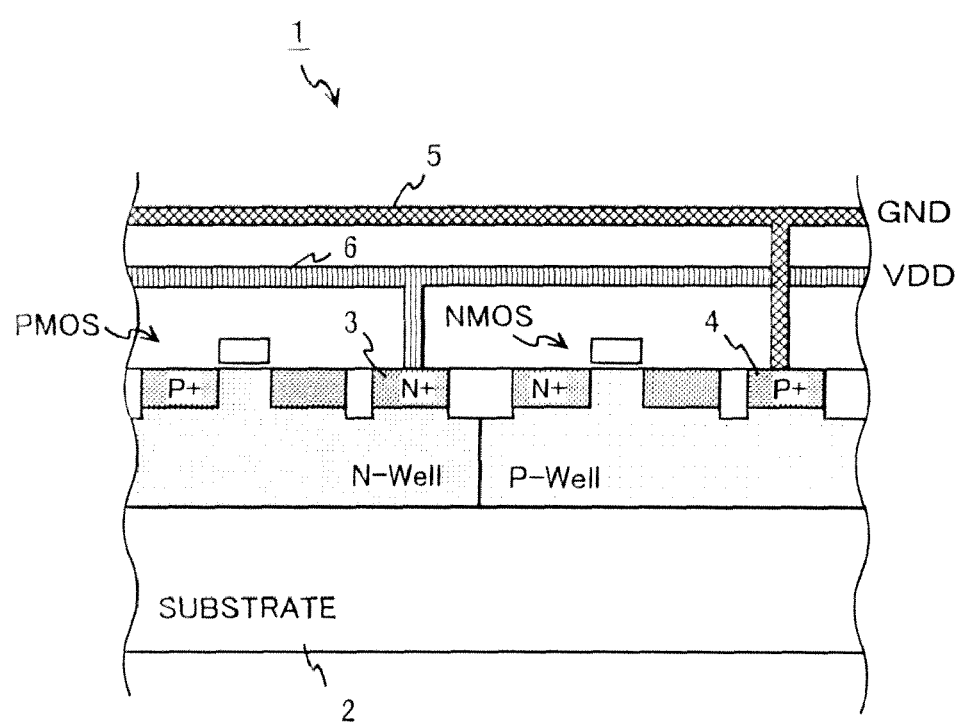
RELATED ART Fig. 22

SEMICONDUCTOR INTEGRATED DEVICE AND MANUFACTURING METHOD FOR THE SAME

The present Application is a Divisional Application of U.S. patent application Ser. No. 12/314,011, filed on Dec. 2, 2008 now U.S. Pat. No. 8,129,793.

This application is based upon, claims the benefit of priority of, and incorporates by reference the contents of Japanese Patent Application No. 2007-313113, filed on Dec. 4, 2007, and Japanese Patent Application No. 2008-298144, filed on Nov. 21, 2008.

BACKGROUND

1. Field of the Invention

The present invention relates to a semiconductor integrated device and a manufacturing method for the same.

2. Description of Related Art

FIG. 22 shows a schematic view of a cross-section of a related-art typical semiconductor integrated device 1. As shown in FIG. 22, the semiconductor integrated device 1 has wells for PMOS transistors and NMOS transistors formed on a substrate 2. Each well has a tap 3 or 4 formed in its top. Lines 5, 6 via which to supply a power supply voltage VDD and ground voltage GND are connected to the taps 3, 4. By this means, ground voltage GND or power supply voltage VDD is supplied as a well potential to each well.

Technology for reducing semiconductor integrated devices in size is disclosed in Japanese Unexamined Patent Application Publication No. 2007-5763. In this Japanese Unexamined Patent Application Publication, an N-type buried layer is positioned in a P-type semiconductor substrate, and P-type and N-type wells are formed immediately under the surface of the P-type semiconductor substrate. The N-type well is electrically connected to the N-type buried layer. A P-type contact region is selectively formed through the N-type buried layer directly under the P-type well so that the P-type well is not electrically cut off the P-type semiconductor substrate by the N-type buried layer, and thereby the P-type well is electrically connected to the P-type semiconductor substrate.

With the above configuration, the N-type well is supplied with potential from the N-type buried layer, and the P-type well is supplied with potential via the P-type semiconductor substrate. Hence, a tap to supply potential to the P-type well does not need to be formed in the semiconductor substrate surface, and thus reduction in size of the semiconductor device and the like are possible.

SUMMARY

With the technique disclosed in the above-cited Japanese Unexamined Patent Application Publication, it is possible to reduce semiconductor integrated devices in size, but because the potential of wells of the same conductivity type as the semiconductor substrate is supplied via the semiconductor substrate, the potential may not be stably supplied depending on the resistance of the semiconductor substrate. Hence, the potential of the wells of the same conductivity type as the semiconductor substrate becomes unstable, and the problem of latch-up may occur.

A first exemplary aspect of an exemplary embodiment of the present invention is a semiconductor integrated device comprising a semiconductor substrate, a first impurity layer of a first conductivity type formed in the semiconductor substrate, a second impurity layer of a second conductivity type formed on the first impurity layer, a first well of the first conductivity type formed on the second impurity layer and supplied with potential from the first impurity layer via an impurity region of the first conductivity type selectively formed in a part of the second impurity layer, and a second well of the second conductivity type formed on the second impurity layer and supplied with potential from the second impurity layer, wherein the impurity concentrations of the first impurity layer and the impurity region are higher than that of the first well, and the impurity concentration of the second impurity layer is higher than that of the second well.

A second exemplary aspect of an exemplary embodiment of the present invention is a manufacturing method for a semiconductor integrated device comprising, forming a second impurity layer of a second conductivity type that is higher in impurity concentration than a second well of the second conductivity type on a first impurity layer of a first conductivity type that is higher in impurity concentration than a first well of the first conductivity type, forming the first well of the first conductivity type on the second impurity layer of the second conductivity type on the first impurity layer of the first conductivity type, the first well being supplied with potential from the first impurity layer of the first conductivity type, and forming the second well of the second conductivity type on the second impurity layer of the second conductivity type on the first impurity layer of the first conductivity type, the second well being supplied with potential from the second impurity layer of the second conductivity type.

According to the semiconductor integrated device of the present invention, the potential of the first wells of the first conductivity type and the potential of the second wells of the second conductivity type are supplied respectively via the impurity layer of the first conductivity type and the impurity layer of the second conductivity type that are high in impurity concentration from below each well. These two layers form well potential supply lines of low resistance and hence can stably supply well potentials to the wells of the same conductivity types.

In the semiconductor integrated device of the present invention, via the two impurity layers of high concentration under the wells, the wells of the same conductivity types are stably supplied with potentials, and hence latch-up can be prevented not depending on the resistance of the semiconductor substrate. Thus, it is possible to achieve the reduction in size of the semiconductor integrated device by reducing the number of the tap areas via which to supply well potentials and at the same time to prevent the occurrence of latch-up.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 22 is a sectional view of a semiconductor integrated device according to the related art.

DETAILED DESCRIPTION OF THE EXEMPLARY EMBODIMENTS

Embodiments of the Invention

Figure 1A:
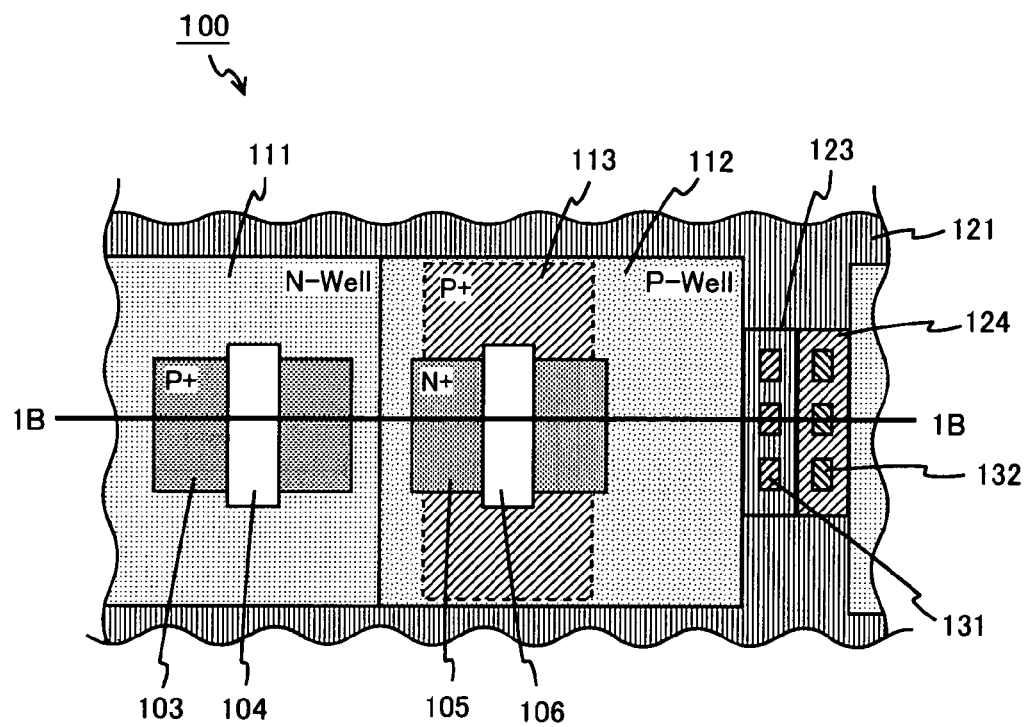
FIG. 1A is a plan view of a semiconductor integrated device according to an embodiment.
Figure 1B:
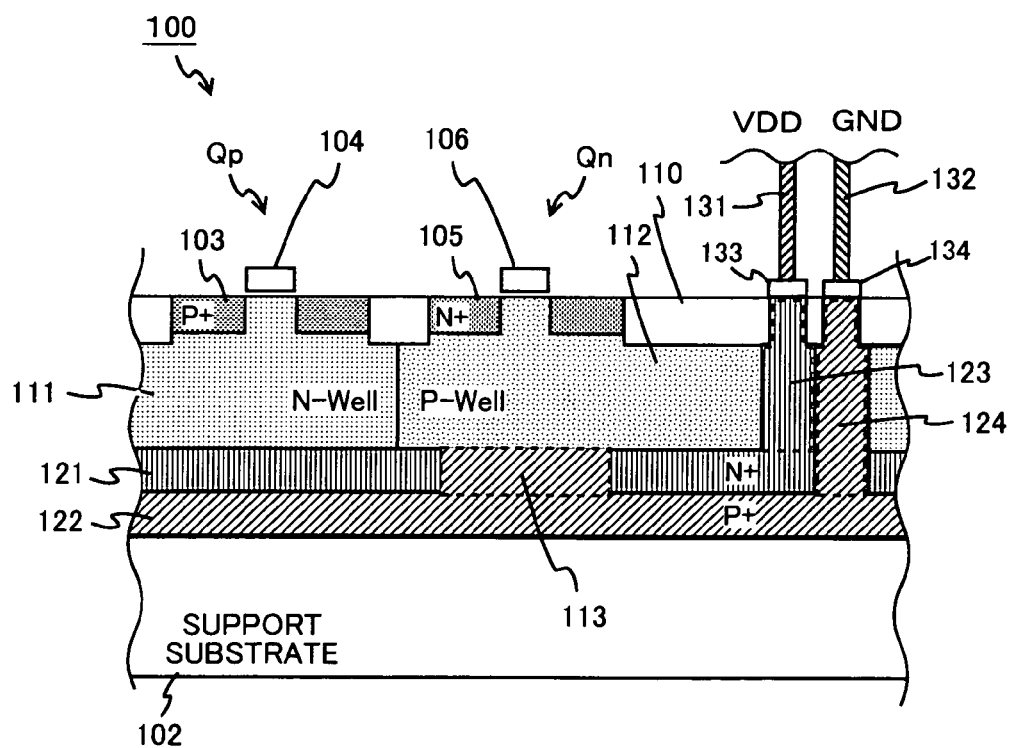
FIG. 1B is a sectional view of the semiconductor integrated device according to the embodiment.

An embodiment of the present invention will be described below with reference to the drawings. FIGS. 1A and 1B are a plan view and a sectional view of a semiconductor integrated device 100 according to the present embodiment. FIG. 1A is a plan view of the semiconductor integrated device 100, and FIG. 1B is a sectional view taken along line 1B-1B of FIG. 1A. Note that element separation regions 110 described later are omitted in FIG. 1A.

As shown in FIGS. 1A, 1B, the semiconductor integrated device 100 comprises a support substrate 102, second wells 111 of a second conductivity type (hereinafter referred to as N-type wells), first wells 112 of a first conductivity type (hereinafter referred to as P-type wells), a second impurity layer 121 of the second conductivity type that is higher in impurity concentration than the N-type well 111 (hereinafter referred to as an N-type impurity layer), and a first impurity layer 122 of the first conductivity type that is higher in impurity concentration than the P-type well 112 (hereinafter referred to as a P-type impurity layer).

The support substrate 102 is formed of an N-type or P-type semiconductor that is lower in impurity concentration than the N-type well 111 or the P-type well 112, or an insulator.

The P-type impurity layer 122 doped with an impurity such as boron at a higher concentration than the P-type well 112 is positioned on top of the support substrate 102. The impurity concentration of the P-type impurity layer 122 is ten times or more that of the P-type well 112. To name a specific number, the impurity concentration is preferably $1 \times 10^{18}$ [cm$^{-3}$] or greater.

The P-type impurity layer 122 is formed on substantially the entire top of the support substrate 102 by epitaxial growth. The P-type impurity layer 122 may be formed by injecting ions into a semiconductor layer formed on the support substrate 102 by epitaxial growth and having an impurity concentration about the same as or lower than the P-type well 112 and then performing thermal diffusion treatment. A first supply voltage supplying region 124 (hereinafter referred to as a P-type tap) is positioned on part of the P-type impurity layer 122, which region has substantially the same impurity concentration as the P-type impurity layer 122. This P-type tap 124 is electrically connected to a metal line 132 to which ground voltage GND (first supply voltage) is supplied, via a first supply voltage terminal 134 (hereinafter referred to as a GND terminal). By this means, the P-type impurity layer 122 and the metal line 132 are electrically connected, and the P-type impurity layer 122 can supply ground voltage GND to the P-type well 112.

An N-type impurity layer 121 doped with an impurity such as arsenic at a higher concentration than the N-type well 111 is positioned on top of the P-type impurity layer 122. The impurity concentration of the N-type impurity layer 121 is also ten times or more that of the N-type well 111 as with the above. To name a specific number, the impurity concentration is preferably $1 \times 10^{18}$ [cm$^{-3}$] or greater.

The N-type impurity layer 121 may be formed on substantially the entire top of the P-type impurity layer 122 by epitaxial growth. As true of the P-type impurity layer 122, the N-type impurity layer 121 may be formed by injecting ions into a semiconductor layer formed on the support substrate 102 by epitaxial growth and having an impurity concentration about the same as or lower than the P-type well 112 and then performing thermal diffusion treatment. A second supply voltage supplying region 123 (hereinafter referred to as an N-type tap) is positioned on part of the N-type impurity layer 121, which region has substantially the same impurity concentration as the N-type impurity layer 121. This N-type tap 123 is electrically connected to a metal line 131 to which supply voltage VDD (second supply voltage) is supplied, via a second supply voltage terminal 133 (hereinafter referred to as a VDD terminal). By this means, the N-type impurity layer 121 and the metal line 131 are electrically connected, and the N-type impurity layer 121 can supply the supply voltage VDD to the N-type well 111.

The N-type wells 111 and the P-type wells 112 are positioned on top of the N-type impurity layer 121. A PMOS transistor $Q_p$ is formed on top of the N-type well 111. The PMOS transistor $Q_p$ comprises a gate electrode 104 formed via a gate oxide film on the N-type well 111, and P-type source/drain regions 103 formed on opposite sides of the gate electrode 104 in the top of the N-type well 111. Elements formed on the N-type well 111 may be resistors or the like as well as transistors.

An NMOS transistor $Q_n$ is formed on top of the P-type well 112. The NMOS transistor $Q_n$ comprises a gate electrode 106 formed via a gate oxide film on the P-type well 112, and N-type source/drain regions 105 formed on opposite sides of the gate electrode 106 in the top of the P-type well 112. Elements formed on the P-type well 112 may be resistors or the like as well as transistors.

An element separation region 110 to define element regions is positioned between the PMOS transistor $Q_p$ and the NMOS transistor $Q_n$.

Note that a P-type contact region 113 that is about the same in impurity concentration as the P-type impurity layer 122 is selectively formed in the N-type impurity layer 121 under the P-type well 112 as shown in FIG. 1 and thus the P-type well 112 and the P-type impurity layer 122 are electrically connected via the P-type contact region 113. The P-type contact region 113 is formed like an aperture in the N-type impurity layer 121 having an area equal to or greater than that of a channel region formed between the source/drain regions 105 of the NMOS transistor $Q_n$. As such, the P-type well 112 is in contact with the P-type impurity layer 122 supplying a well potential via the above predetermined area, and hence the well potential can be supplied to the P-type well 112 via low resistance. This P-type contact region 113 is desirably positioned directly under the channel region.

Note that in FIGS. 1A, 1B, only one each of the N-type well 111 and the P-type well 112 is shown for simplicity. Many of each of the N-type well 111 and the P-type well 112 are formed in not shown areas of the semiconductor integrated device 100, and the N-type wells and the P-type wells are electrically connected to the N-type impurity layer 121 and the P-type impurity layer 122 respectively.

Figure 2A:
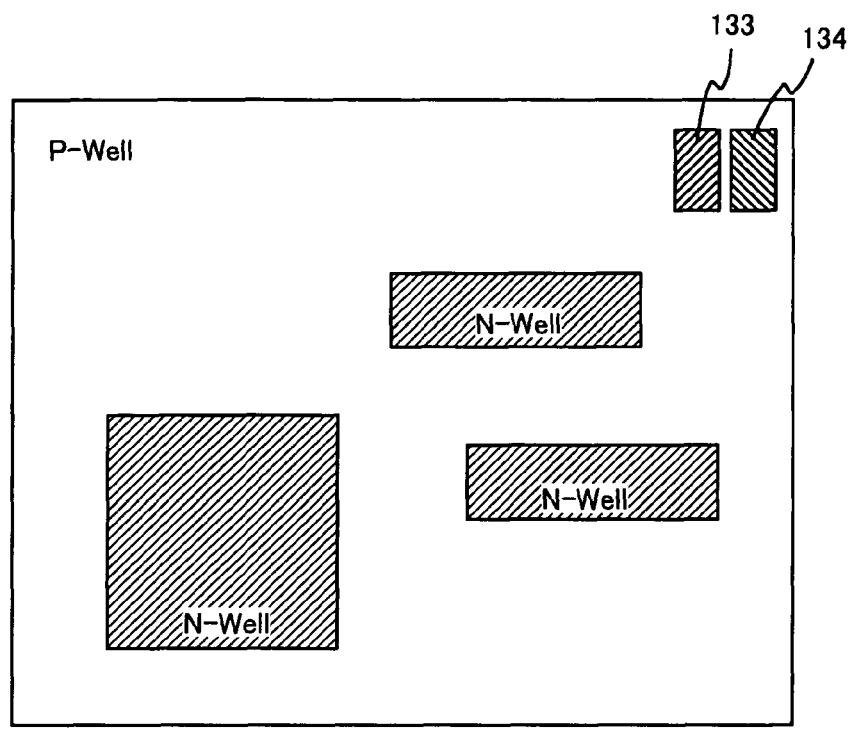
FIG. 2A is a plan view for explaining an arrangement of taps of the semiconductor integrated device according to the embodiment.
Figure 2B:
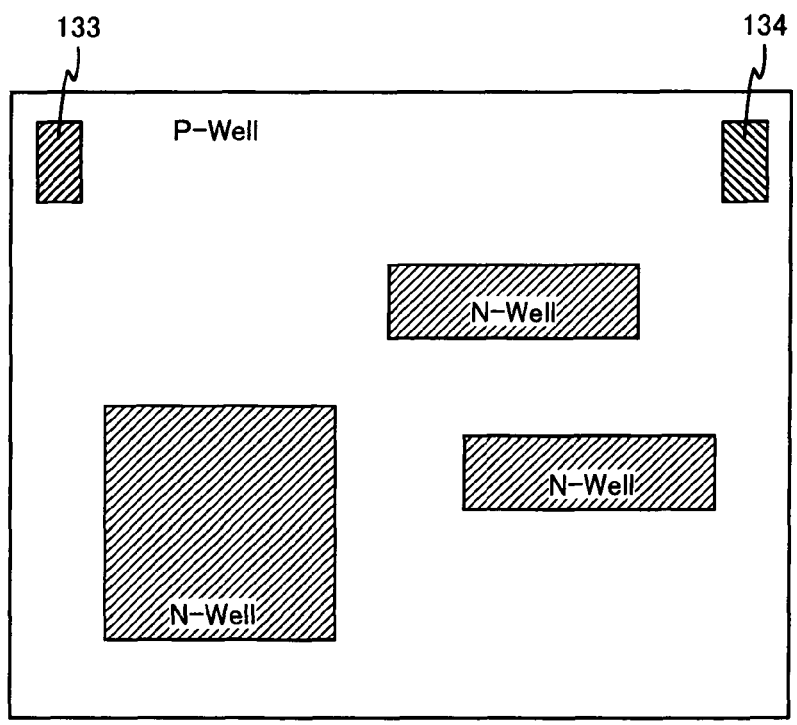
FIG. 2B is a plan view for explaining an arrangement of taps of the semiconductor integrated device according to the embodiment.

In a related-art typical semiconductor integrated device, a supply voltage terminal needs to be provided on the surface of each well, and a tap needs to be provided under and electrically connected to the supply voltage terminal to supply a well potential from the tap via the supply voltage terminal. For the semiconductor integrated device 100 of the present embodiment, at least one each of a pair of the VDD terminal 133 and the N-type tap 123 and a pair of the GND terminal and the P-type tap 124 needs to be provided in the integrated device. Potentials supplied from the N-type tap 123 and the P-type tap 124 via these VDD and GND terminals are supplied respectively via the N-type impurity layer 121 and the P-type impurity layer 122 to the N-type and P-type wells from below. FIG. 2A shows a plan view for the case where the VDD terminal 133 and the GND terminal 134 are placed adjacent to each other, and FIG. 2B shows a plan view for the case where they are placed respectively in different ends of the integrated device. Note that in the plan views of FIGS. 2A, 2B, the element separation regions 110, etc., are omitted.

As shown in FIGS. 2A, 2B, by placing the N-type tap 123 and the P-type tap 124 in ends of the semiconductor integrated device 100 where elements such as transistors are not formed, the integration density can be efficiently increased, and the semiconductor integrated device can be made smaller and higher in density. The N-type tap 123 and the P-type tap 124 can be placed in any place where elements such as transistors are not formed, not being limited to ends as shown in FIGS. 2A, 2B. For example, the N-type tap 123 and the P-type tap 124 can be placed in a place where a P-type or N-type semiconductor layer other than the P-type or N-type well, or an insulating layer is positioned. In the examples shown in FIGS. 2A, 2B, the area other than the N-type wells is a P-type well, but conversely the N-type wells of the examples may be replaced with P-type wells, and the P-type well replaced with an N-type well.

Figure 3:
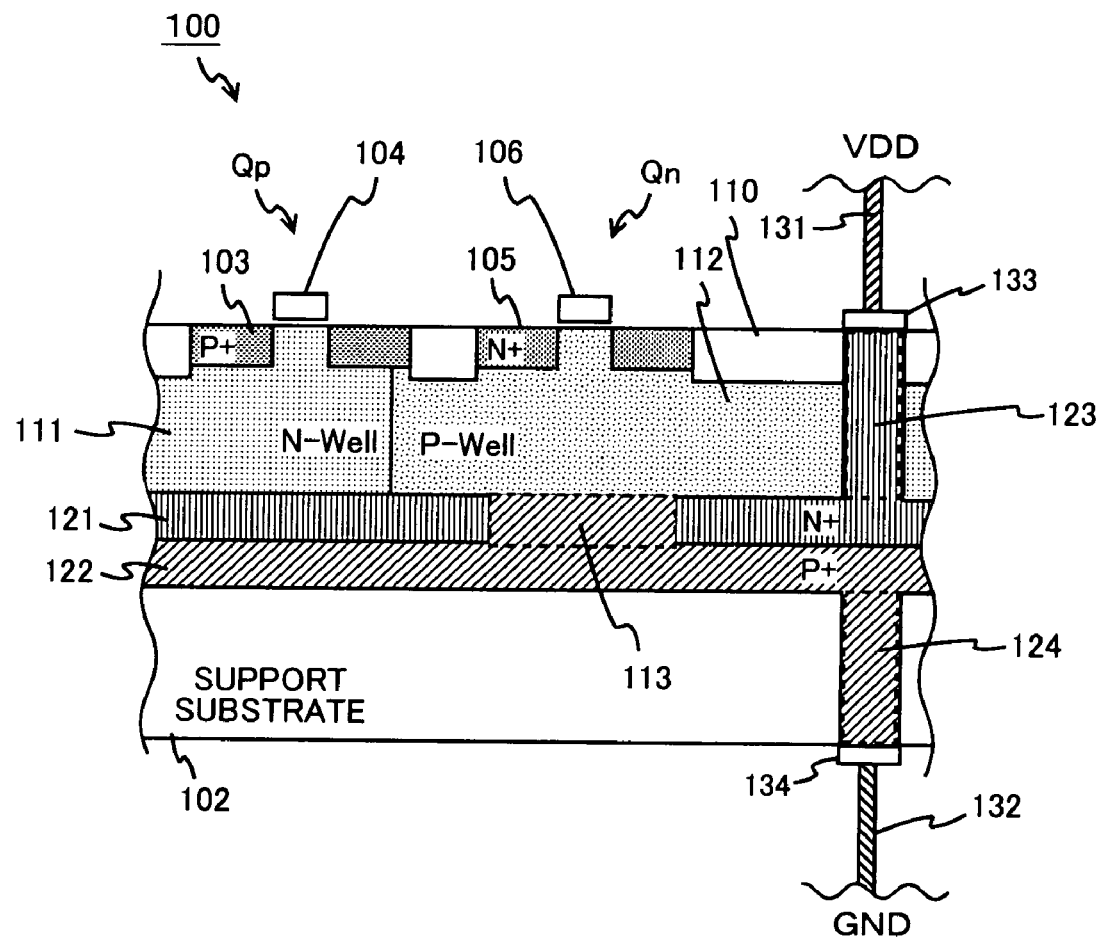
FIG. 3 is a sectional view of the semiconductor integrated device according to the embodiment.

As shown in the sectional view of FIG. 3, a contact hole may be made in the support substrate 102, and the P-type tap 124 may be provided therein. In this case, the GND terminal 134 need not be formed in the element formed surface of the semiconductor integrated device 100, and hence the semiconductor integrated device 100 can be made further smaller and higher in density.

As such, in the semiconductor integrated device 100 of the present embodiment, the N-type impurity layer 121 and the P-type impurity layer 122 that are higher in impurity concentration than the N-type well 111 and the P-type well 112 are positioned on the support substrate and respectively supply well potentials to the N-type well 111 and the P-type well 112 present on them.

In a related-art typical semiconductor integrated device, a supply voltage terminal and a tap need to be provided for each well to supply a well potential from the tap via the supply voltage terminal. Because the supply voltage terminal and the tap are provided for each well, it is difficult to make the integrated device smaller. Further, since the area and location of the supply voltage terminal is restricted by regions of elements such as transistors and resistors formed on wells, it may be difficult to stably supply well potential, depending on the area and location of the supply voltage terminal, and hence elements formed on wells may cause latch-up or may be adversely affected by noise. Moreover, also in the case of supplying well potential via a substrate as in the prior art described in the above-cited Japanese Unexamined Patent Application Publication, it may be difficult to stably supply well potential, depending on the resistance of the substrate. For example, in the case of supplying ground voltage GND to P-type wells via a P-type substrate, if the resistance of the P-type substrate is high, the potential of a P-type well may rise above ground voltage GND, and thus there is a possibility of causing latch-up.

In contrast, in the semiconductor integrated device 100 of the present embodiment, the well potentials of the N-type well 111 and the P-type well 112 are supplied via the N-type impurity layer 121 and the P-type impurity layer 122 electrically connected to the N-type and P-type wells at their bottom. Thus, a supply voltage terminal and a tap need not be provided for each well, but at least one supply voltage terminal need only be provided on the device surface for each conductivity type. Accordingly, the area of the integrated device is reduced by the areas of supply voltage terminals that would otherwise be provided respectively for wells, and thus the integrated device can be made smaller and higher in density.

Because the N-type impurity layer 121 and the P-type impurity layer 122 are low in resistance, well potentials can be stably supplied to the N-type well 111 and the P-type well 112, and the problem of the occurrence of latch-up can be solved. Moreover, the P-type well 112 and the P-type impurity layer 122 are connected via a P-type contact region with a predetermined area, which also contributes to supplying stable well potential to the P-type well 112.

A two-layer structure of the N-type impurity layer 121 and the P-type impurity layer 122 form a PN diode whose laterally-extending area is very large and substantially the same as that of the integrated device and thus constitutes an ESD (electrostatic discharge) protection element between VDD power supply and ground. With the N-type impurity layer 121 and the P-type impurity layer 122, the ESD resistance of the integrated device is improved without a need for a separate ESD protection circuit. Accordingly, the device area is reduced by the area of the ESD protection circuit that would otherwise be separately provided.

A manufacturing method for the semiconductor integrated device 100 having the above configuration will be described with reference to a process drawing of FIGS. 4A, 4B to 11A, 11B. FIGS. 4A to 11A are plan views, and FIGS. 4B to 11B are sectional views. The plan and sectional views correspond to the completion drawings of FIGS. 1A and 1B respectively.

Figure 4A:
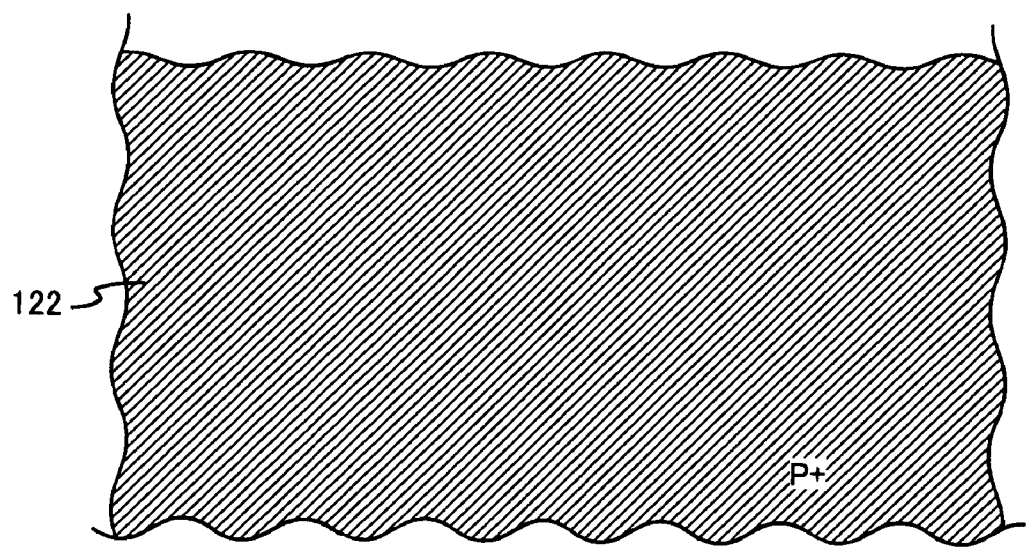
FIG. 4A is a plan view showing a manufacturing process for the semiconductor integrated device of FIGS. 1A, 1B.
Figure 4B:
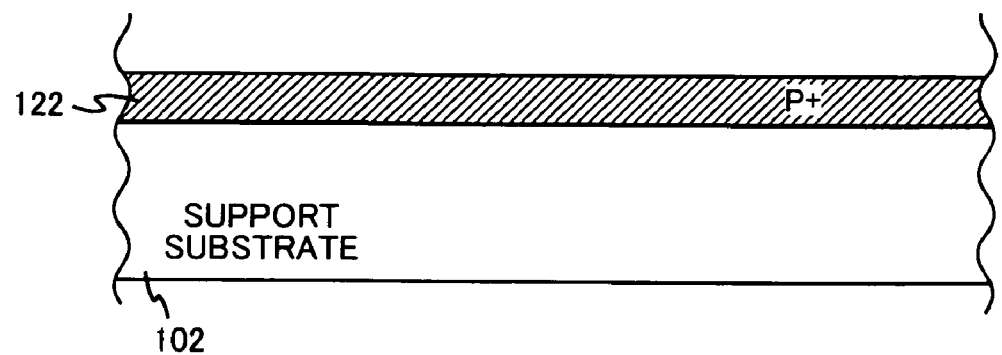
FIG. 4B is a sectional view showing the manufacturing process for the semiconductor integrated device of FIGS. 1A, 1B.

First, a first process is shown in FIGS. 4A, 4B. As shown in FIGS. 4A, 4B, the P-type impurity layer 122 that is higher in impurity concentration than the P-type well 112 is formed on the support substrate 102 by epitaxial growth. For example, boron or the like is doped as a P-type impurity.

Figure 5A:
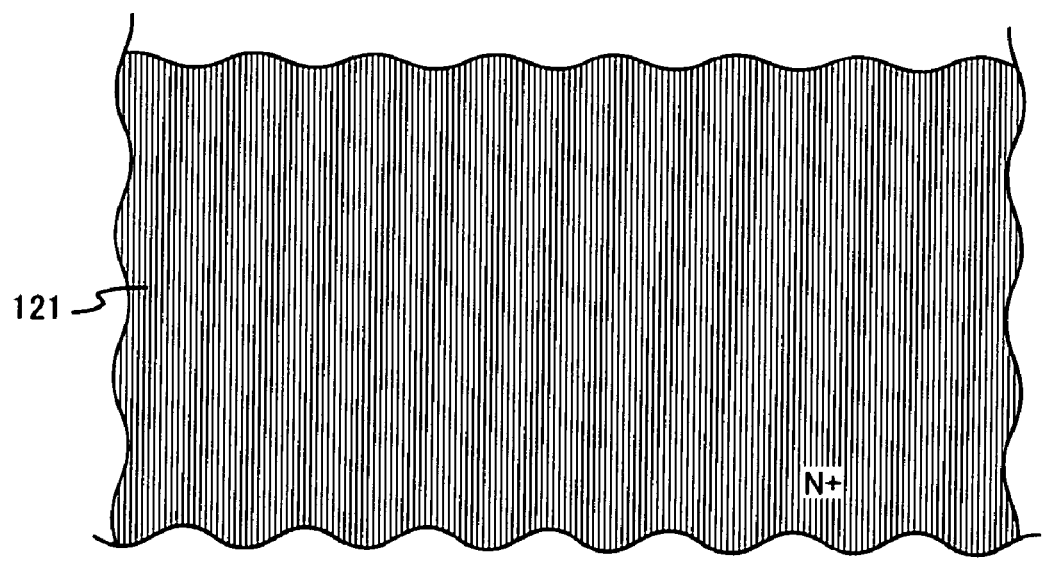
FIG. 5A is a plan view showing a manufacturing process for the semiconductor integrated device of FIGS. 1A, 1B.
Figure 5B:
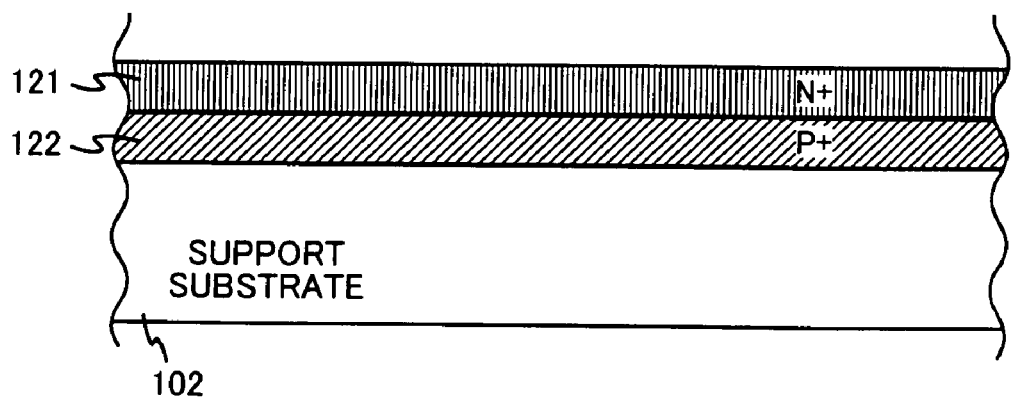
FIG. 5B is a sectional view showing the manufacturing process for the semiconductor integrated device of FIGS. 1A, 1B.

Next, a second process is shown in FIGS. 5A, 5B. As shown in FIGS. 5A, 5B, the N-type impurity layer 121 that is higher in impurity concentration than the N-type well 111 is formed on the P-type impurity layer 122 by epitaxial growth. For example, arsenic or the like is doped as an N-type impurity.

Figure 6A:
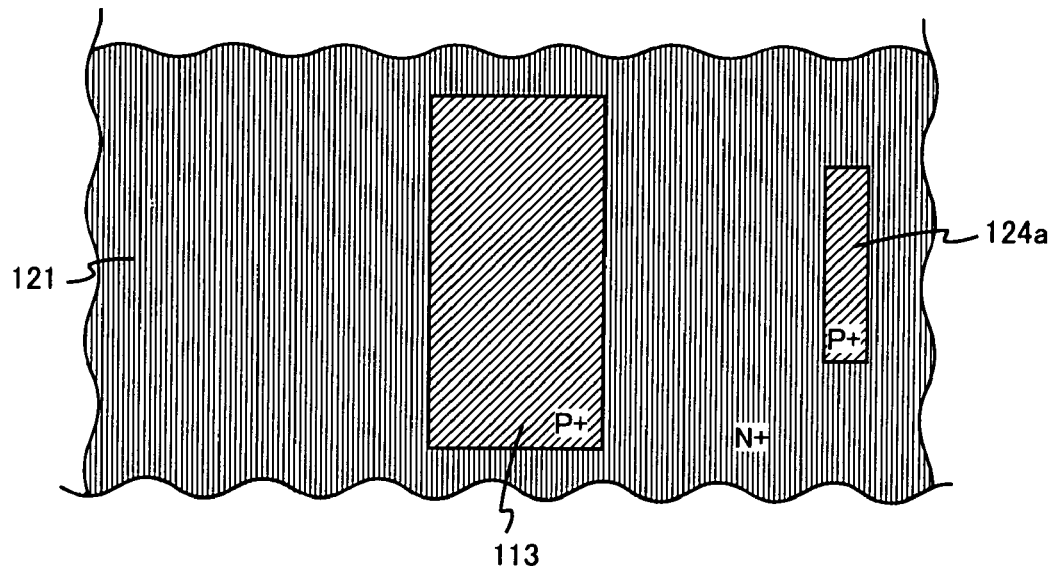
FIG. 6A is a plan view showing a manufacturing process for the semiconductor integrated device of FIGS. 1A, 1B.
Figure 6B:
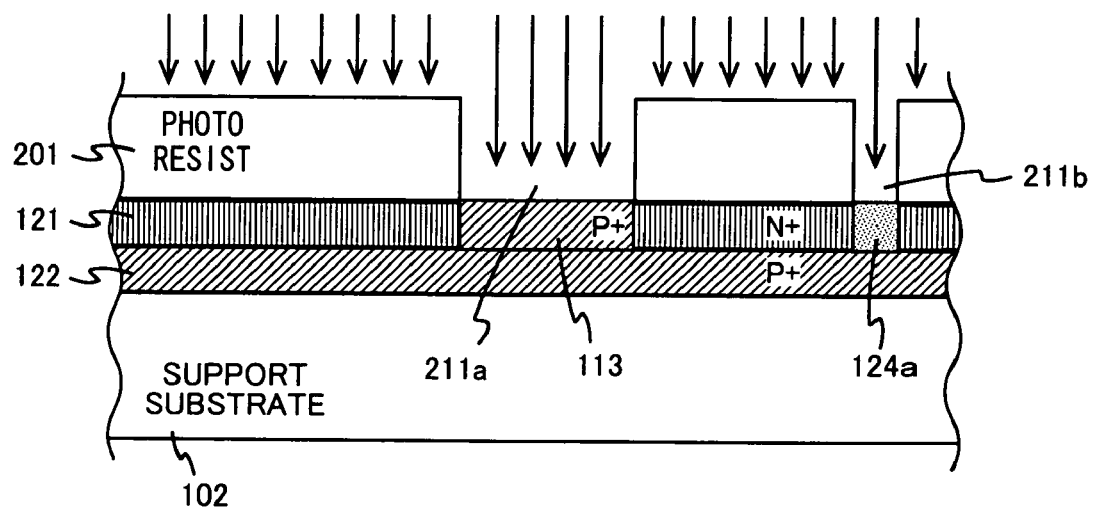
FIG. 6B is a sectional view showing the manufacturing process for the semiconductor integrated device of FIGS. 1A, 1B.

Next, a third process is shown in FIGS. 6A, 6B. As shown in FIGS. 6A, 6B, first a photo-resist film 201 is formed. Then, openings 211a, 211b are formed by selectively etching parts of the photo-resist film 201 by photolithography technology. Then, using the photo-resist film 201 as a mask, a P-type impurity (such as boron) is injected into the N-type impurity layer 121 by an ion injection method and thereafter is diffused by heat treatment. Thereby the P-type contact region 113 and a part 124a of the P-type tap 124 are formed under the openings 211a, 211b.

Figure 7A:
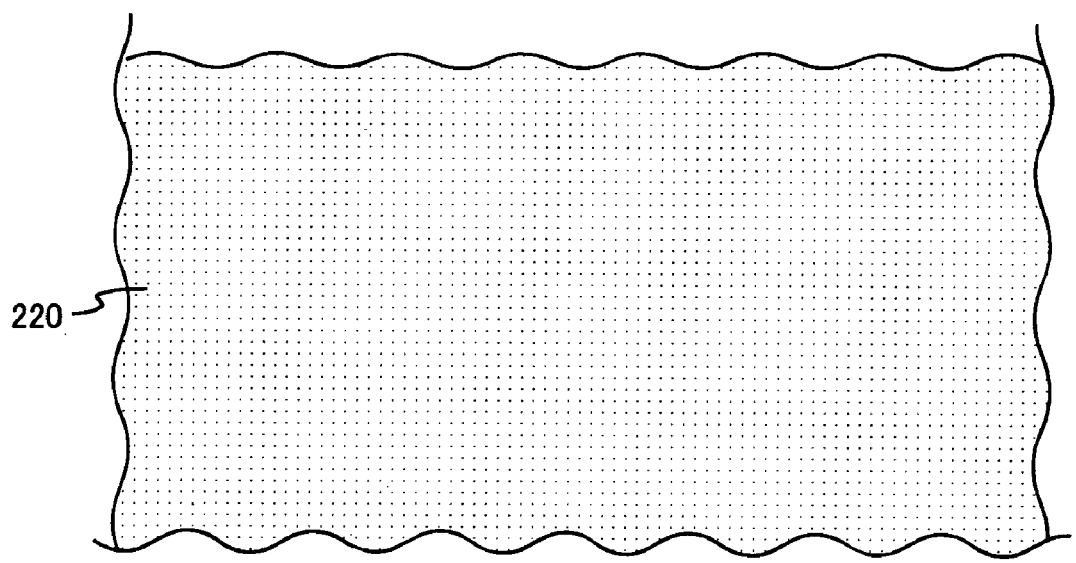
FIG. 7A is a plan view showing a manufacturing process for the semiconductor integrated device of FIGS. 1A, 1B.
Figure 7B:
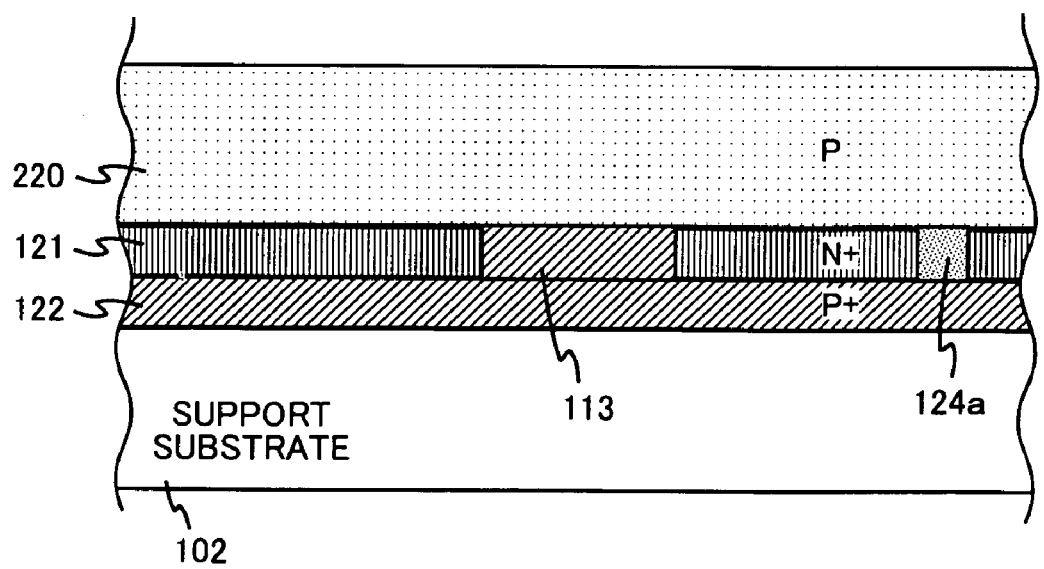
FIG. 7B is a sectional view showing the manufacturing process for the semiconductor integrated device of FIGS. 1A, 1B.

Next, a fourth process is shown in FIGS. 7A, 7B. As shown in FIGS. 7A, 7B, a P-type semiconductor layer 220 that is lower or about the same in impurity concentration as the P-type well 112 is formed on the N-type impurity layer 121, the P-type contact region 113, and the part 124a of the P-type tap by epitaxial growth.

Figure 8A:
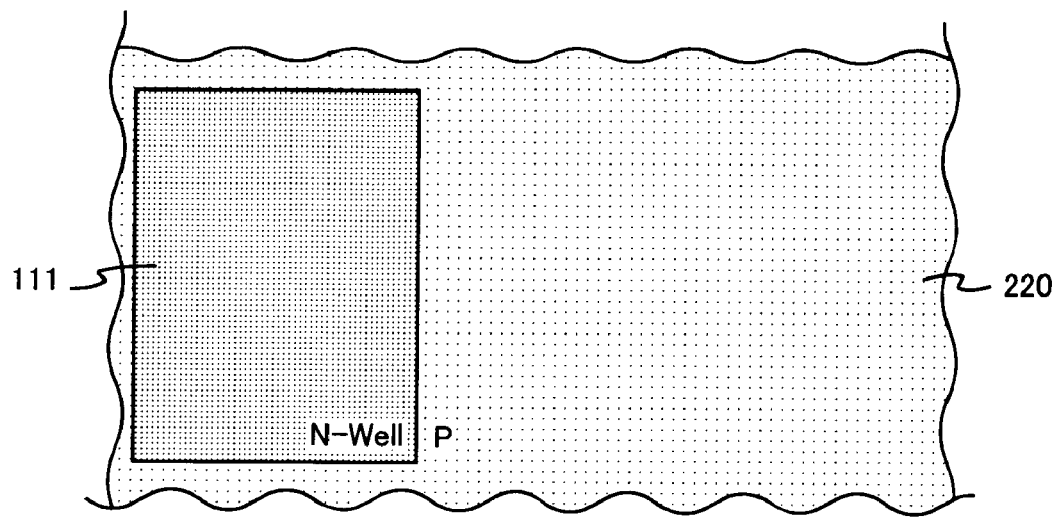
FIG. 8A is a plan view showing a manufacturing process for the semiconductor integrated device of FIGS. 1A, 1B.
Figure 8B:
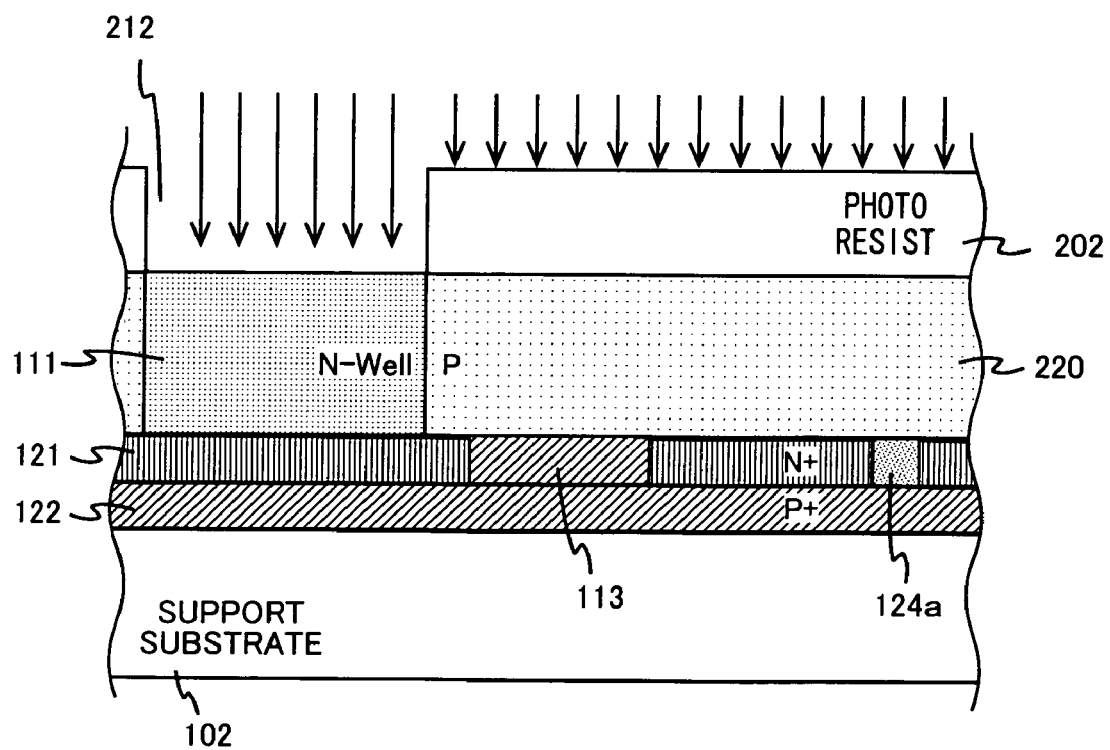
FIG. 8B is a sectional view showing the manufacturing process for the semiconductor integrated device of FIGS. 1A, 1B.

Next, a fifth process is shown in FIGS. 8A, 8B. As shown in FIGS. 8A, 8B, first a photo-resist film 202 is formed. Then, an opening 212 is formed by selectively etching a part of the photo-resist film 202 by photolithography technology. Then, using the photo-resist film 202 as a mask, an N-type impurity (such as arsenic) is injected into the P-type semiconductor layer 220 by the ion injection method and thereafter is diffused by heat treatment. Thereby the N-type well 111 is formed under the opening 212.

Figure 9A:
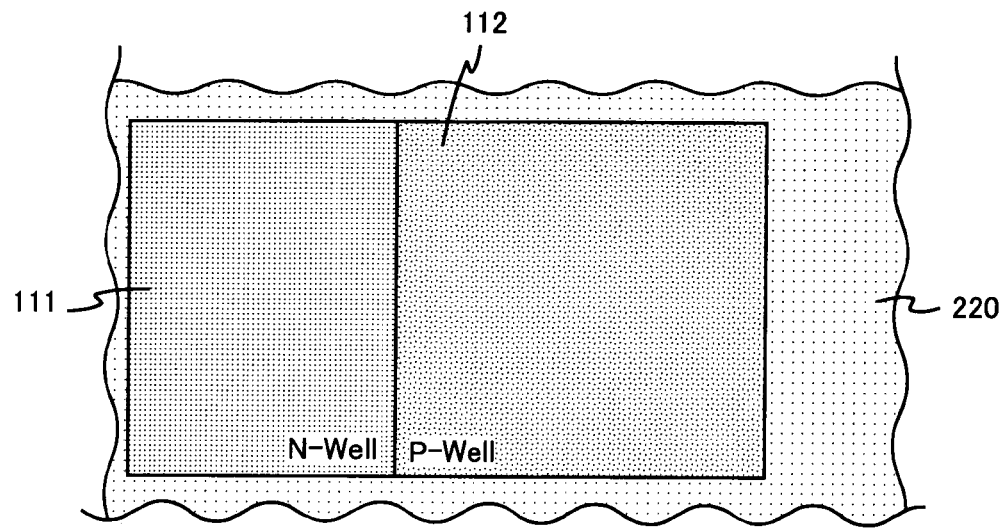
FIG. 9A is a plan view showing a manufacturing process for the semiconductor integrated device of FIGS. 1A, 1B.
Figure 9B:
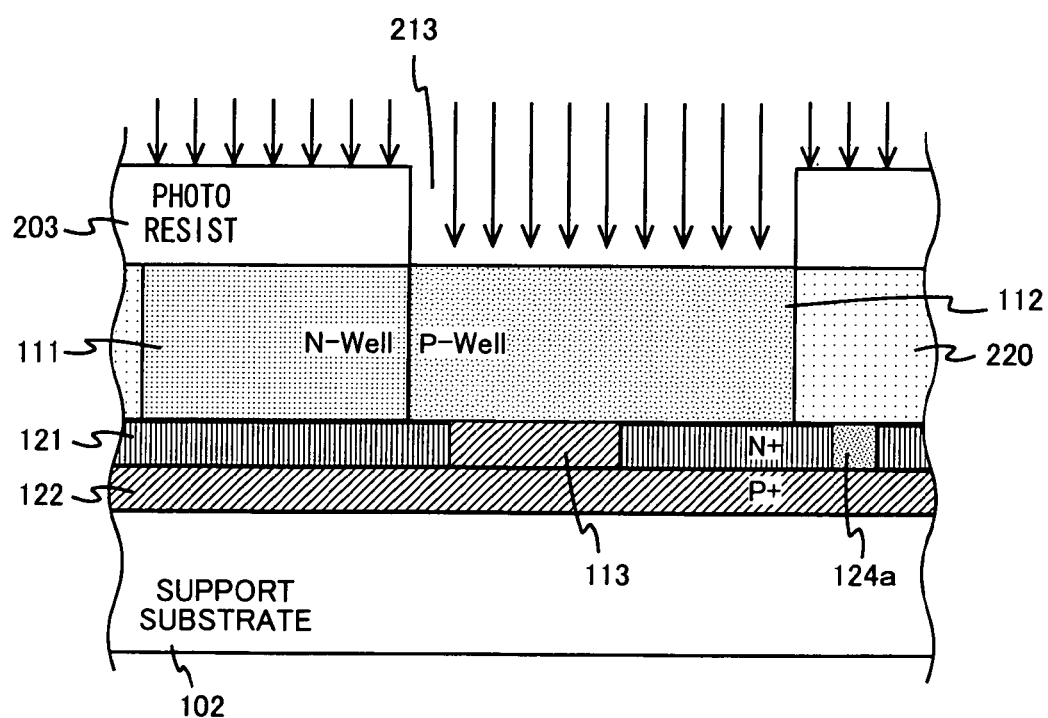
FIG. 9B is a sectional view showing the manufacturing process for the semiconductor integrated device of FIGS. 1A, 1B.

Next, a sixth process is shown in FIGS. 9A, 9B. As shown in FIGS. 9A, 9B, first a photo-resist film 203 is formed. Then, an opening 213 is formed by selectively etching a part of the photo-resist film 203 by photolithography technology. Then, using the photo-resist film 203 as a mask, a P-type impurity (such as boron) is injected into the P-type semiconductor layer 220 by the ion injection method and thereafter is diffused by heat treatment. Thereby the P-type well 112 is formed under the opening 213.

Figure 10A:
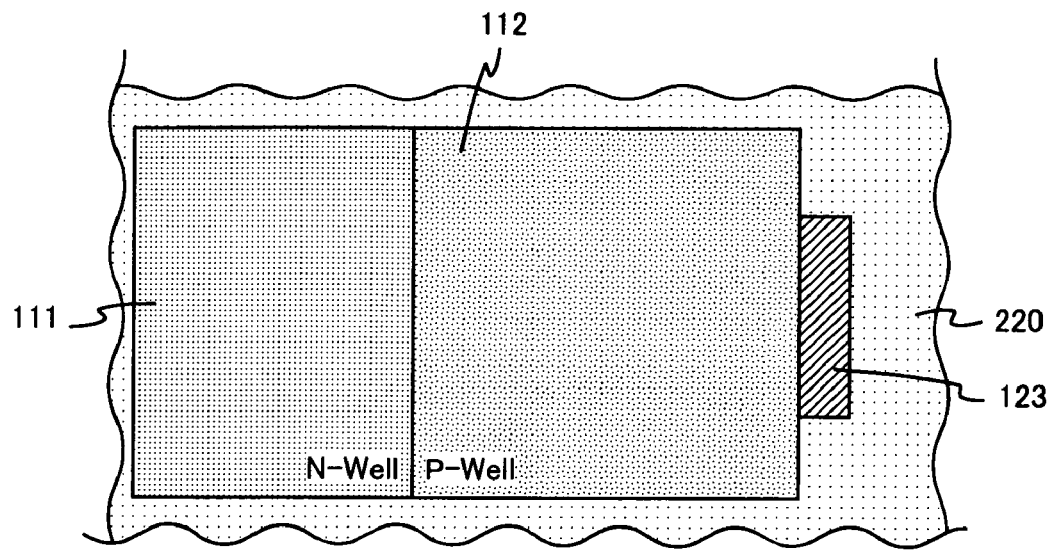
FIG. 10A is a plan view showing a manufacturing process for the semiconductor integrated device of FIGS. 1A, 1B.
Figure 10B:
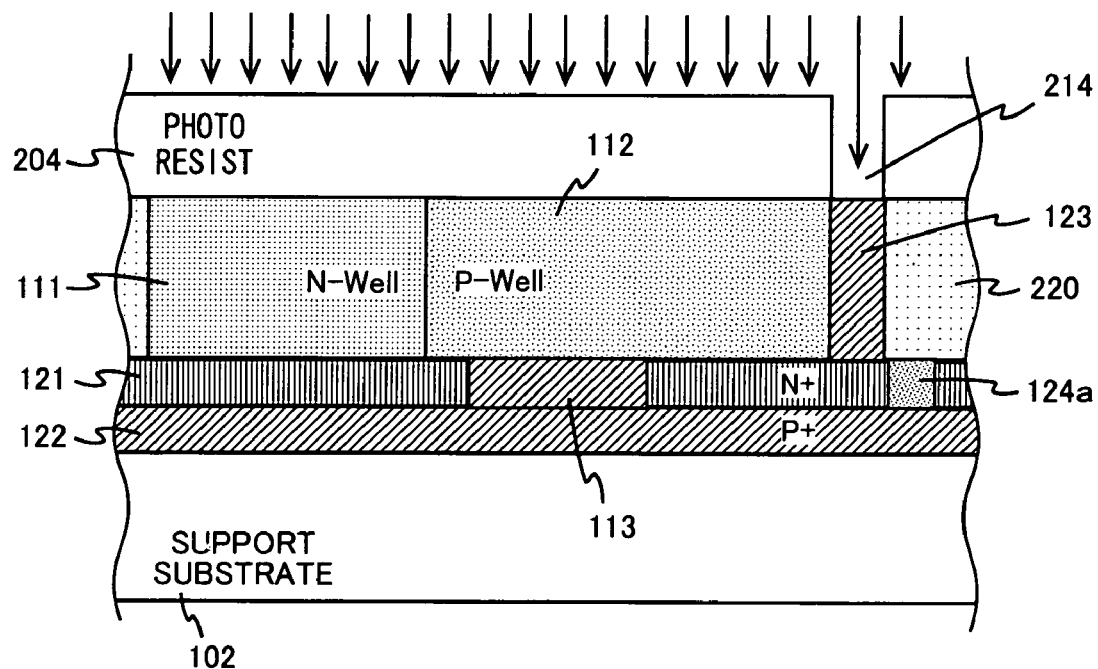
FIG. 10B is a sectional view showing the manufacturing process for the semiconductor integrated device of FIGS. 1A, 1B.

Next, a seventh process is shown in FIGS. 10A, 10B. As shown in FIGS. 10A, 10B, first a photo-resist film 204 is formed. Then, an opening 214 is formed by selectively etching a part of the photo-resist film 204 by photolithography technology. Then, using the photo-resist film 204 as a mask, an N-type impurity (such as arsenic) is injected into the P-type semiconductor layer 220 by the ion injection method and thereafter is diffused by heat treatment. Thereby the N-type tap 123 is formed under the opening 214.

Figure 11A:
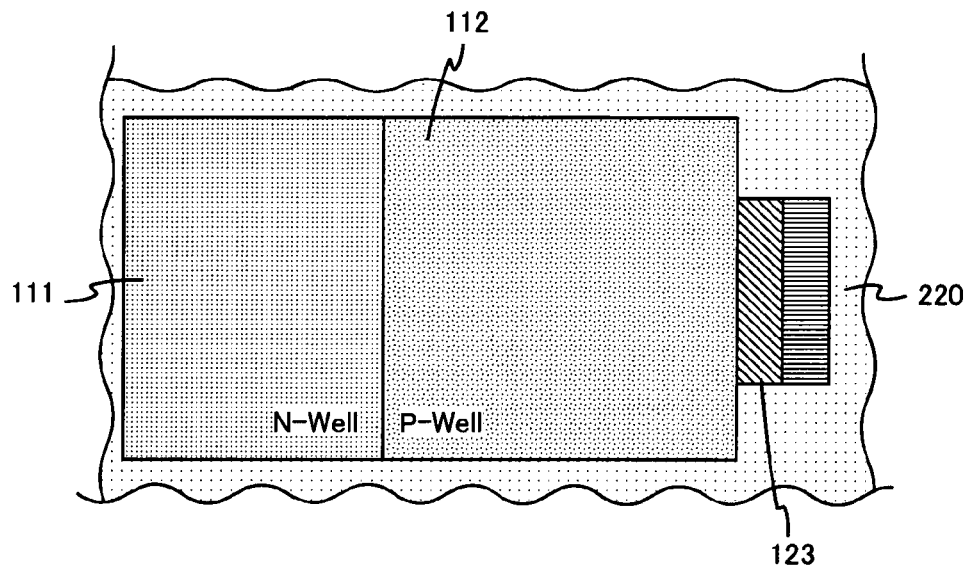
FIG. 11A is a plan view showing a manufacturing process for the semiconductor integrated device of FIGS. 1A, 1B.
Figure 11B:
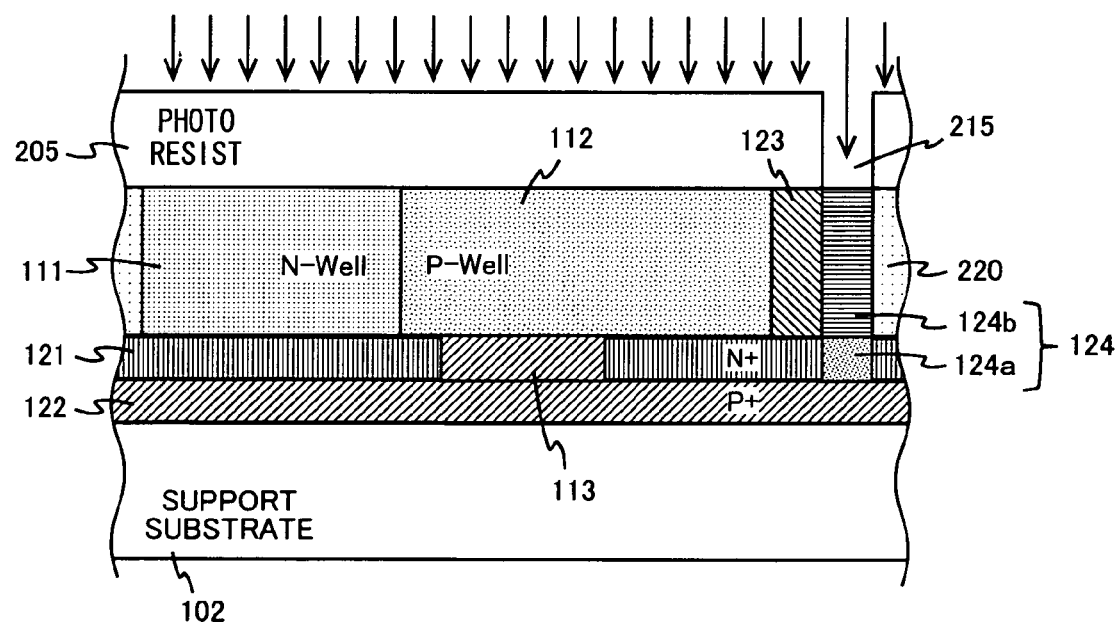
FIG. 11B is a sectional view showing the manufacturing process for the semiconductor integrated device of FIGS. 1A, 1B.

Next, an eighth process is shown in FIGS. 11A, 11B. As shown in FIGS. 11A, 11B, first a photo-resist film 205 is formed. Then, an opening 215 is formed by selectively etching a part of the photo-resist film 205 by photolithography technology. Then, using the photo-resist film 205 as a mask, a P-type impurity (such as boron) is injected into the P-type semiconductor layer 220 by the ion injection method and thereafter is diffused by heat treatment. Thereby a part 124b of the P-type tap 124 is formed under the opening 215 and together with the part 124a forms the P-type tap 124.

Then, as shown in FIGS. 1A, 1B, element separation regions 110 are formed between the N-type well 111, the P-type well 112, the N-type tap 123, and the P-type tap 124. Further, the P-type source/drain regions 103 are formed in the N-type well 111, and the N-type source/drain regions 105 are formed in the P-type well 112. Moreover, a gate oxide film is formed thereon, and gate electrodes 104, 106 are formed on the gate oxide film. Yet further, metal lines are formed on the N-type tap 123 and the P-type tap 124 by sputtering. In this way, the semiconductor integrated device 100 of the present embodiment is produced.

A variant of the manufacturing method for the semiconductor integrated device 100 will be described below with reference to a process drawing of FIGS. 12A, 12B to 20A, 20B. FIGS. 12A to 20A are plan views, and FIGS. 12B to 20B are sectional views. The plan and sectional views correspond to the completion drawings of FIGS. 1A and 1B respectively.

Figure 12A:
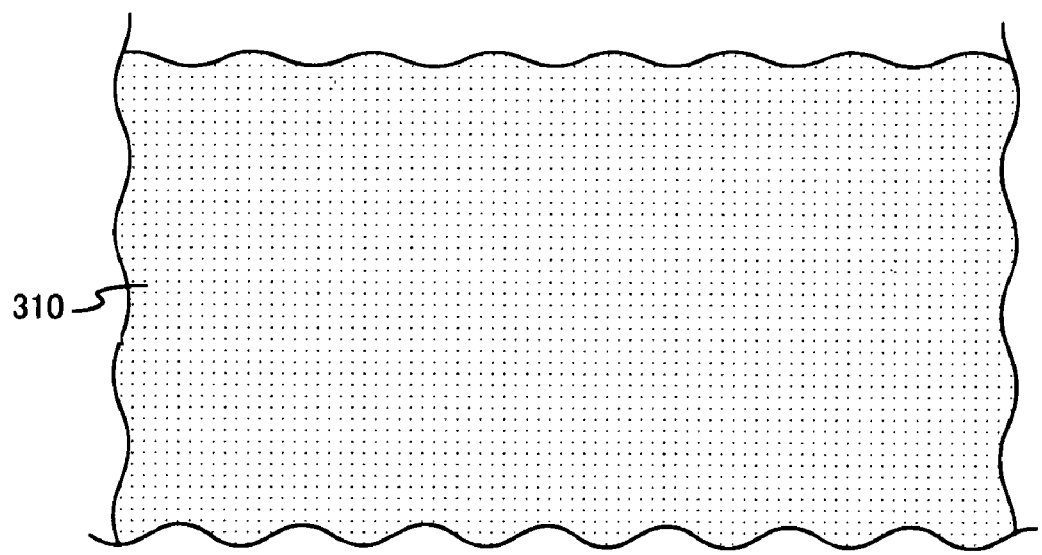
FIG. 12A is a plan view showing a manufacturing process for the semiconductor integrated device of FIGS. 1A, 1B.
Figure 12B:
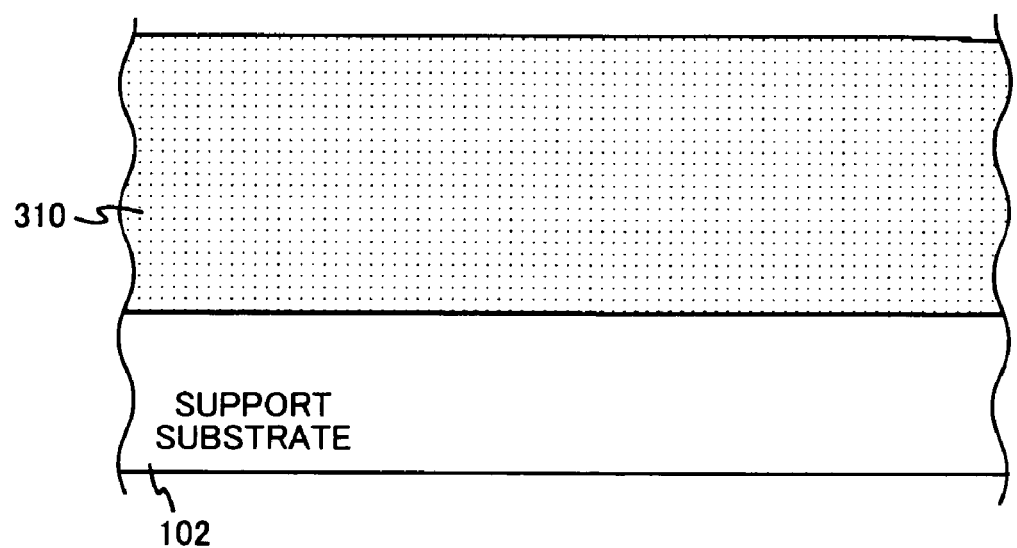
FIG. 12B is a sectional view showing the manufacturing process for the semiconductor integrated device of FIGS. 1A, 1B.

First, a first process is shown in FIGS. 12A, 12B. As shown in FIGS. 12A, 12B, a P-type semiconductor layer 310 that is lower or about the same in impurity concentration as the P-type well 112 is formed on the support substrate 102 by epitaxial growth.

Figure 13A:
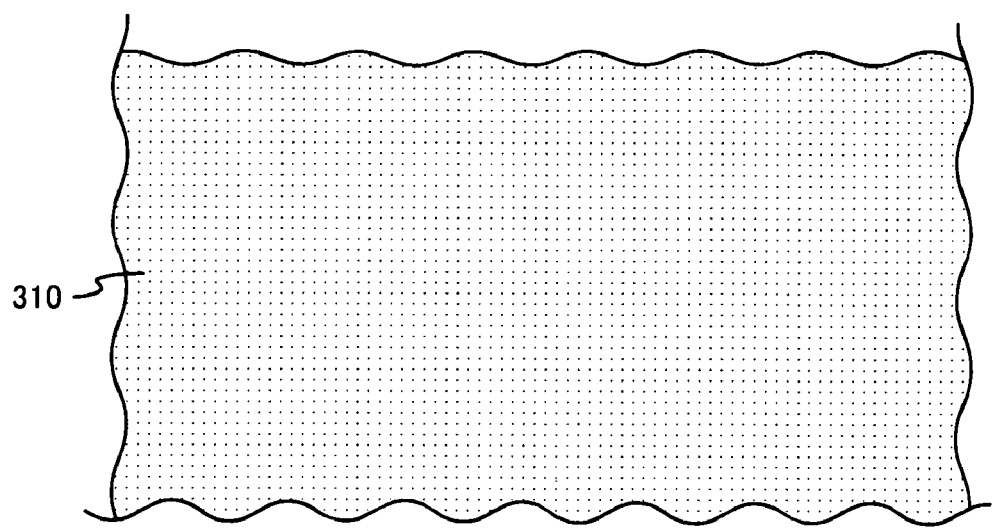
FIG. 13A is a plan view showing a manufacturing process for the semiconductor integrated device of FIGS. 1A, 1B.
Figure 13B:
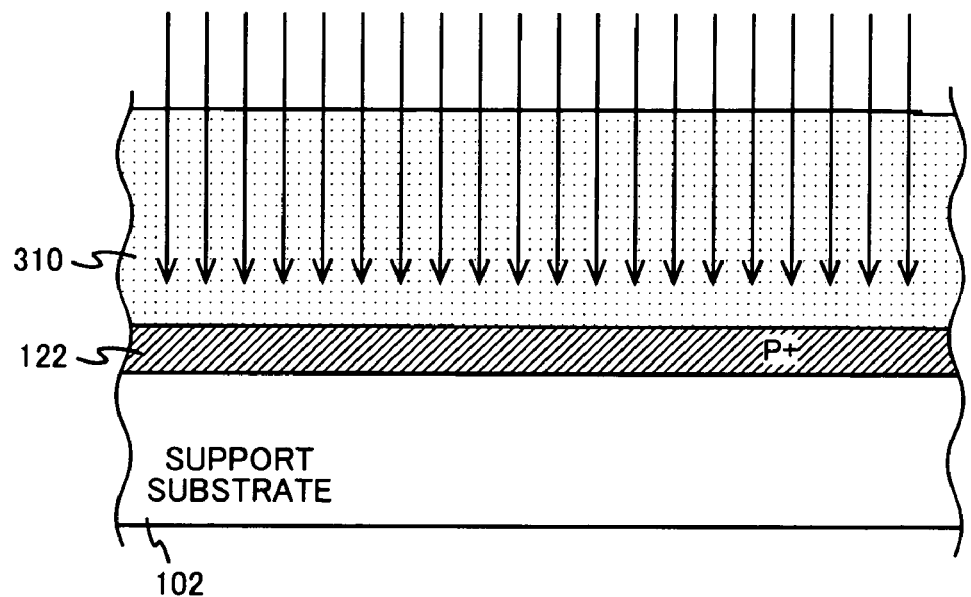
FIG. 13B is a sectional view showing the manufacturing process for the semiconductor integrated device of FIGS. 1A, 1B.

Next, a second process is shown in FIGS. 13A, 13B. As shown in FIGS. 13A, 13B, a P-type impurity (such as boron)

is injected into the P-type semiconductor layer 310 by the ion injection method and thereafter is diffused by heat treatment. Thereby the P-type impurity layer 122 that is higher in impurity concentration than the P-type well 112 is formed.

Figure 14A:
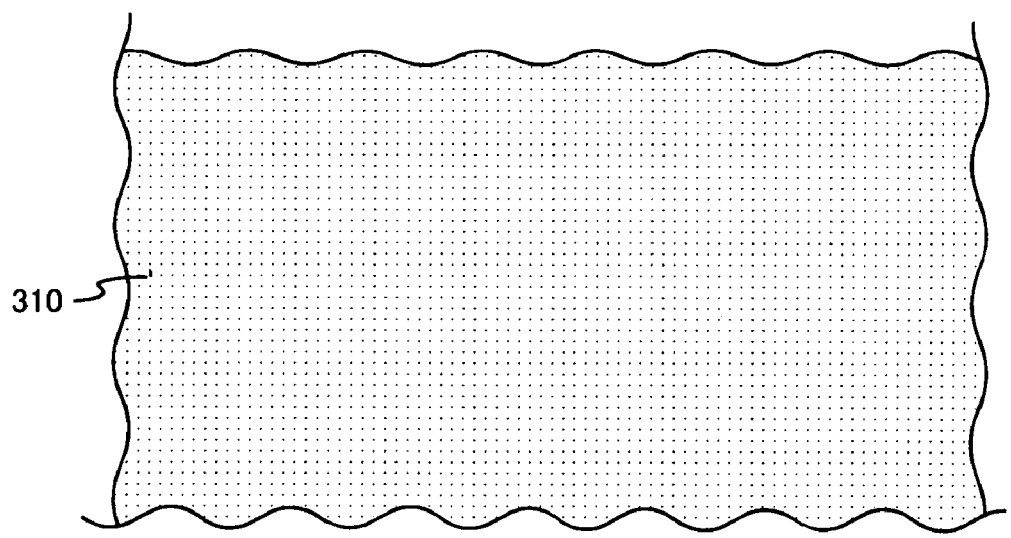
FIG. 14A is a plan view showing a manufacturing process for the semiconductor integrated device of FIGS. 1A, 1B.
Figure 14B:
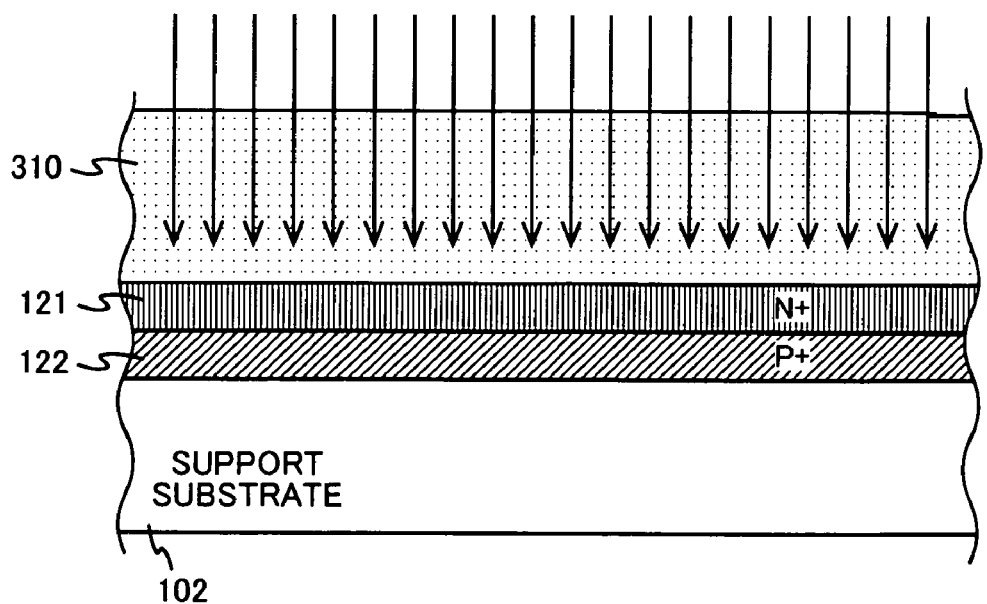
FIG. 14B is a sectional view showing the manufacturing process for the semiconductor integrated device of FIGS. 1A, 1B.

Next, a third process is shown in FIGS. 14A, 14B. As shown in FIGS. 14A, 14B, an N-type impurity (such as arsenic) is injected to a position shallower than the P-type impurity layer 122 in the P-type semiconductor layer 310 by the ion injection method and thereafter is diffused by heat treatment. Thereby the N-type impurity layer 121 that is higher in impurity concentration than the N-type well 111 is formed.

Figure 15A:
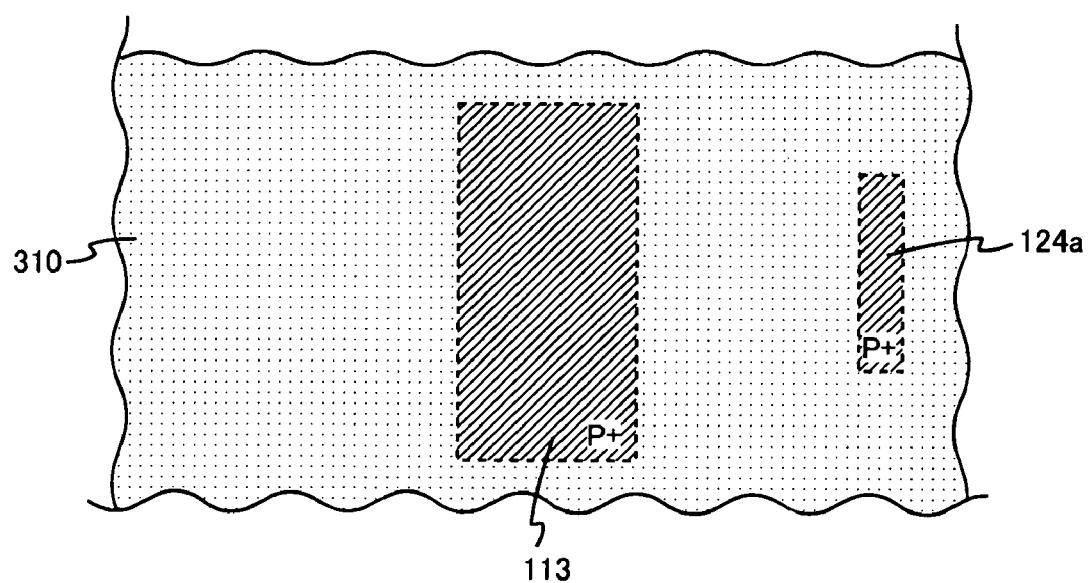
FIG. 15A is a plan view showing a manufacturing process for the semiconductor integrated device of FIGS. 1A, 1B.
Figure 15B:
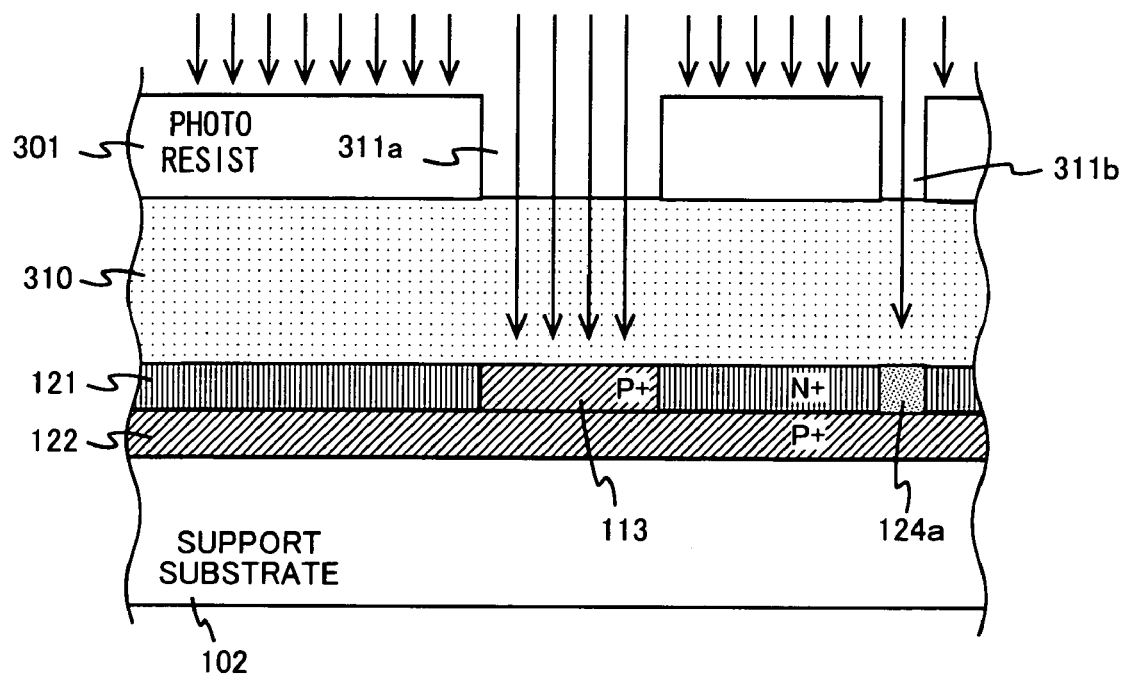
FIG. 15B is a sectional view showing the manufacturing process for the semiconductor integrated device of FIGS. 1A, 1B.

Next, a fourth process is shown in FIGS. 15A, 15B. As shown in FIGS. 15A, 15B, first a photo-resist film 301 is formed. Then, openings 311a, 311b are formed by selectively etching parts of the photo-resist film 301 by photolithography technology. Then, using the photo-resist film 301 as a mask, a P-type impurity (such as boron) is injected into the N-type impurity layer 121 by an ion injection method and thereafter is diffused by heat treatment. Thereby the P-type contact region 113 and the part 124a of the P-type tap 124 are formed under the openings 311a, 311b.

Figure 16A:
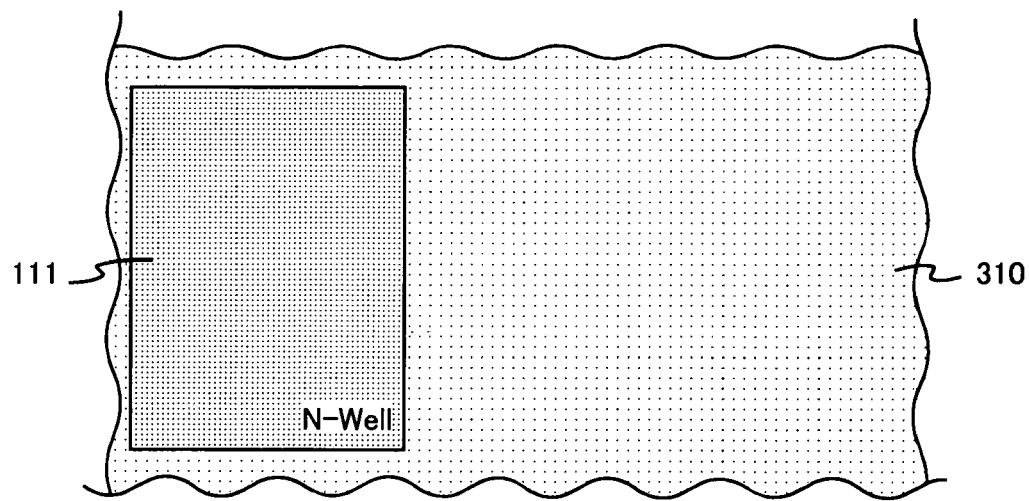
FIG. 16A is a plan view showing a manufacturing process for the semiconductor integrated device of FIGS. 1A, 1B.
Figure 16B:
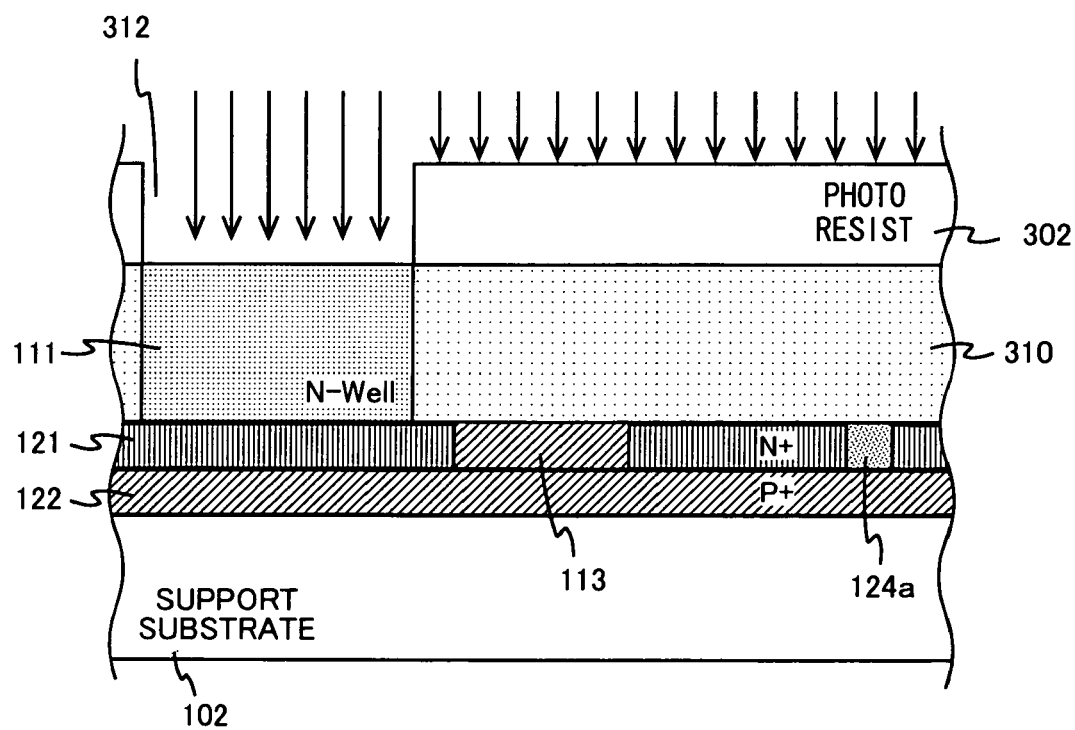
FIG. 16B is a sectional view showing the manufacturing process for the semiconductor integrated device of FIGS. 1A, 1B.

Next, a fifth process is shown in FIGS. 16A, 16B. As shown in FIGS. 16A, 16B, first a photo-resist film 302 is formed. Then, an opening 312 is formed by selectively etching a part of the photo-resist film 302 by photolithography technology. Then, using the photo-resist film 302 as a mask, an N-type impurity (such as arsenic) is injected into the P-type semiconductor layer 310 by the ion injection method and thereafter is diffused by heat treatment. Thereby the N-type well 111 is formed under the opening 312.

Figure 17A:
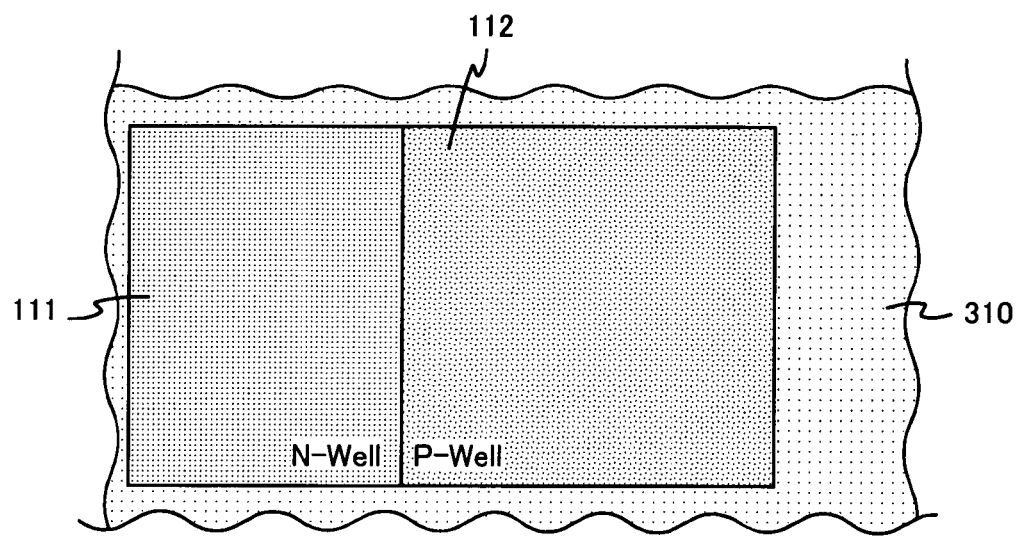
FIG. 17A is a plan view showing a manufacturing process for the semiconductor integrated device of FIGS. 1A, 1B.
Figure 17B:
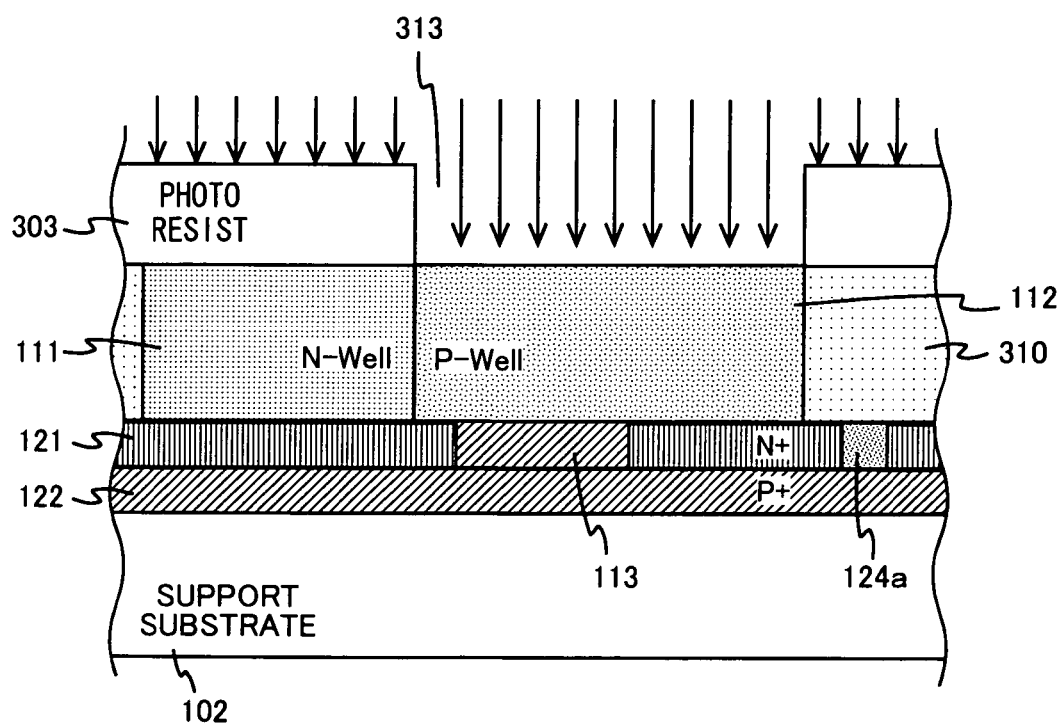
FIG. 17B is a sectional view showing the manufacturing process for the semiconductor integrated device of FIGS. 1A, 1B.

Next, a sixth process is shown in FIGS. 17A, 17B. As shown in FIGS. 17A, 17B, first a photo-resist film 303 is formed. Then, an opening 313 is formed by selectively etching a part of the photo-resist film 303 by photolithography technology. Then, using the photo-resist film 303 as a mask, a P-type impurity (such as boron) is injected into the P-type semiconductor layer 310 by the ion injection method and thereafter is diffused by heat treatment. Thereby the P-type well 112 is formed under the opening 313.

Figure 18A:
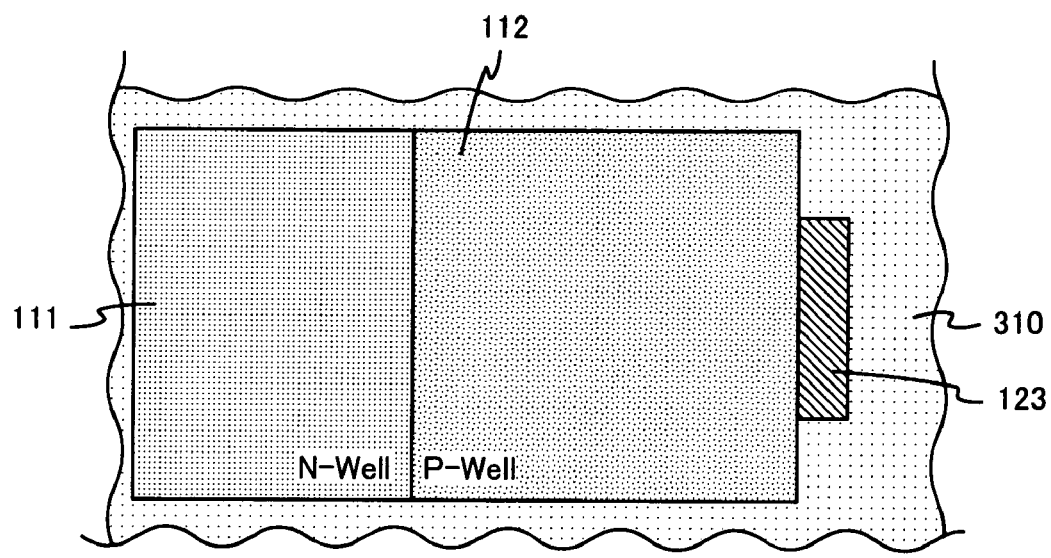
FIG. 18A is a plan view showing a manufacturing process for the semiconductor integrated device of FIGS. 1A, 1B.
Figure 18B:
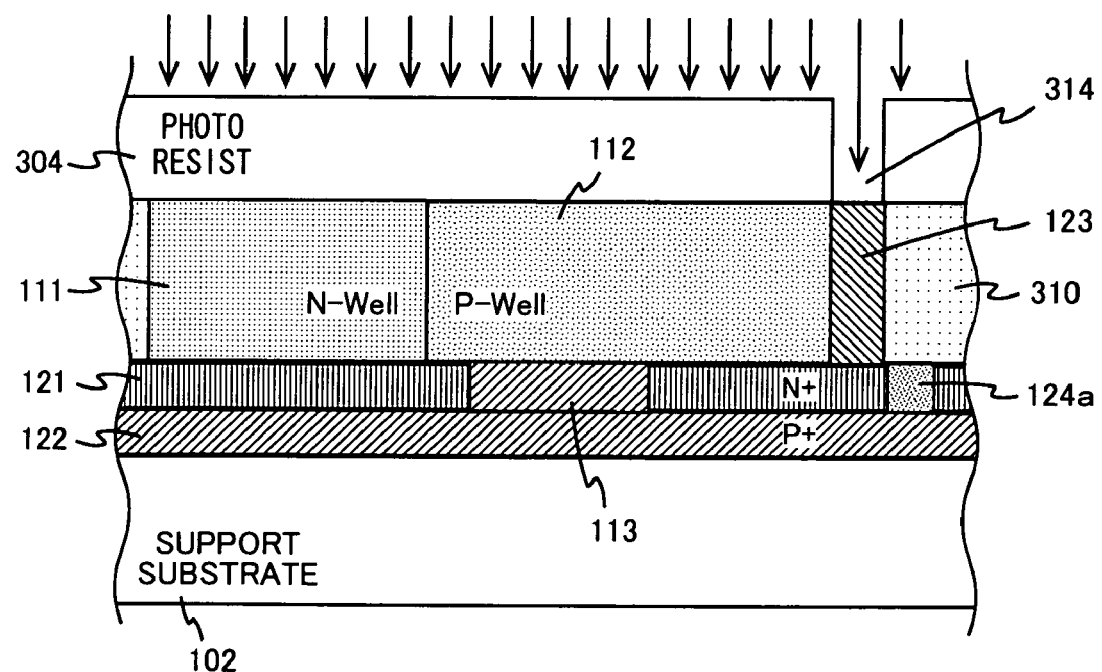
FIG. 18B is a sectional view showing the manufacturing process for the semiconductor integrated device of FIGS. 1A, 1B.

Next, a seventh process is shown in FIGS. 18A, 18B. As shown in FIGS. 18A, 18B, first a photo-resist film 304 is formed. Then, an opening 314 is formed by selectively etching a part of the photo-resist film 304 by photolithography technology. Then, using the photo-resist film 304 as a mask, an N-type impurity (such as arsenic) is injected into the P-type semiconductor layer 310 by the ion injection method and thereafter is diffused by heat treatment. Thereby the N-type tap 123 is formed under the opening 314.

Figure 19A:
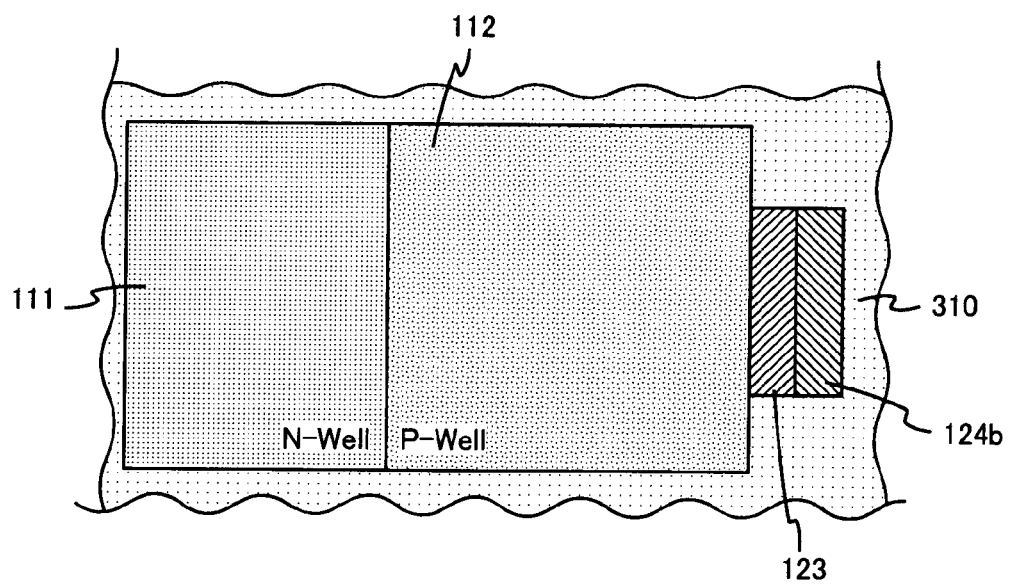
FIG. 19A is a plan view showing a manufacturing process for the semiconductor integrated device of FIGS. 1A, 1B.
Figure 19B:
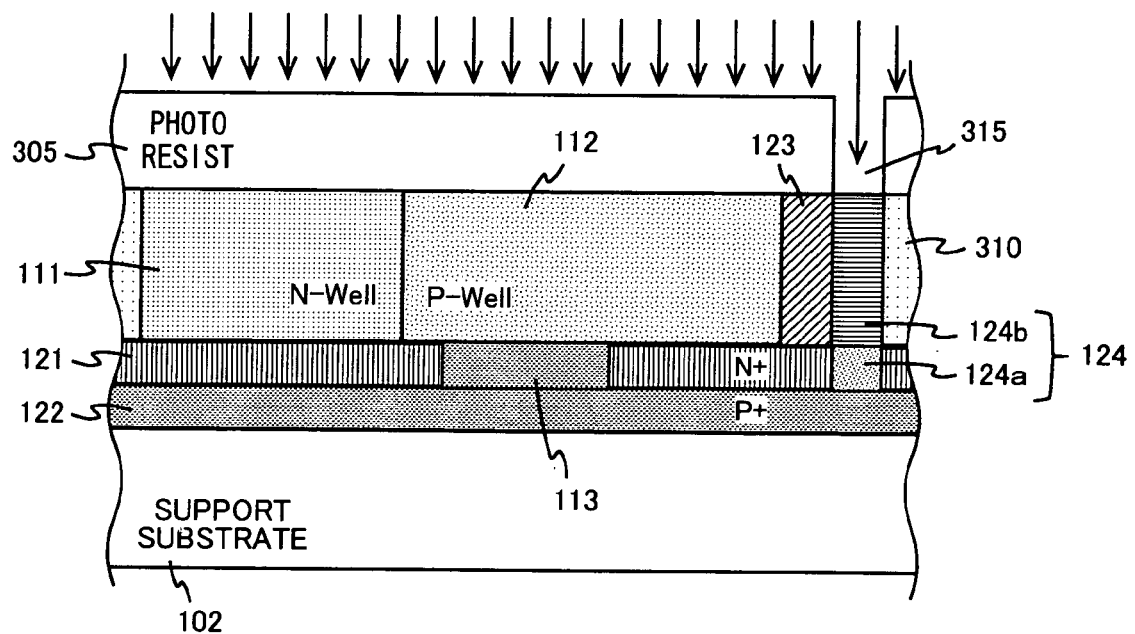
FIG. 19B is a sectional view showing the manufacturing process for the semiconductor integrated device of FIGS. 1A, 1B.

Next, an eighth process is shown in FIGS. 19A, 19B. As shown in FIGS. 19A, 19B, first a photo-resist film 305 is formed. Then, an opening 315 is formed by selectively etching a part of the photo-resist film 305 by photolithography technology. Then, using the photo-resist film 305 as a mask, a P-type impurity (such as boron) is injected into the P-type semiconductor layer 310 by the ion injection method and thereafter is diffused by heat treatment. Thereby the part 124b of the P-type tap 124 is formed under the opening 315 and together with the part 124a forms the P-type tap 124.

Then, as shown in FIGS. 1A, 1B, the element separation regions 110 are formed between the N-type well 111, the P-type well 112, the N-type tap 123, and the P-type tap 124. Further, the P-type source/drain regions 103 are formed in the N-type well 111, and the N-type source/drain regions 105 are formed in the P-type well 112. Moreover, the gate oxide film is formed thereon, and the gate electrodes 104, 106 are formed on the gate oxide film. Yet further, the metal lines are formed on the N-type tap 123 and the P-type tap 124 by sputtering. In this way, the semiconductor integrated device 100 of the present embodiment is produced.

Figure 20:
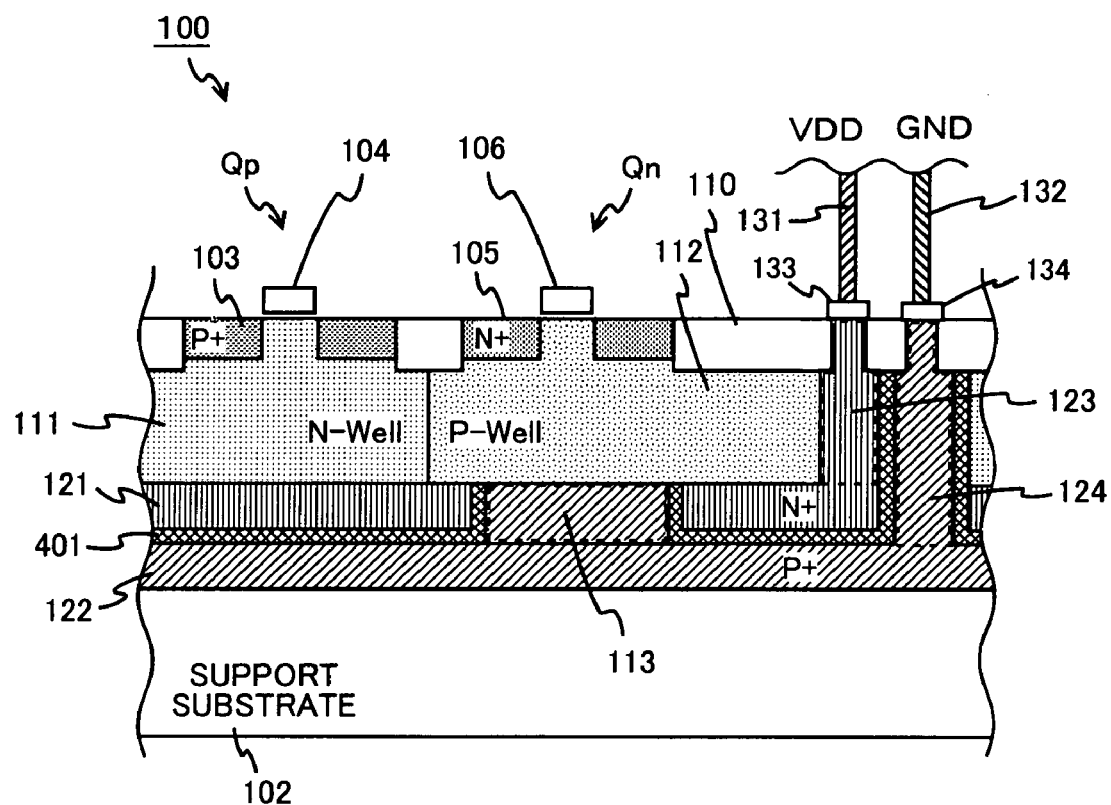
FIG. 20 is a sectional view of a semiconductor integrated device according to another embodiment.

The present invention is not limited to the above embodiment, but changes can be made thereto as needed within the scope of the invention. For example, as shown in FIG. 20, a leak current blocking layer 401 that is lower in impurity concentration than the N-type impurity layer 121 or the P-type impurity layer 122, or that is constituted by an insulating layer such as an oxide film may be positioned between the N-type impurity layer 121 and the P-type impurity layer 122. In this case, the leak current blocking layer 401 can reduce a leak current which may occur because the N-type impurity layer 121 and the P-type impurity layer 122 that are high in impurity concentration are in contact with each other over a wide area.

Figure 21:
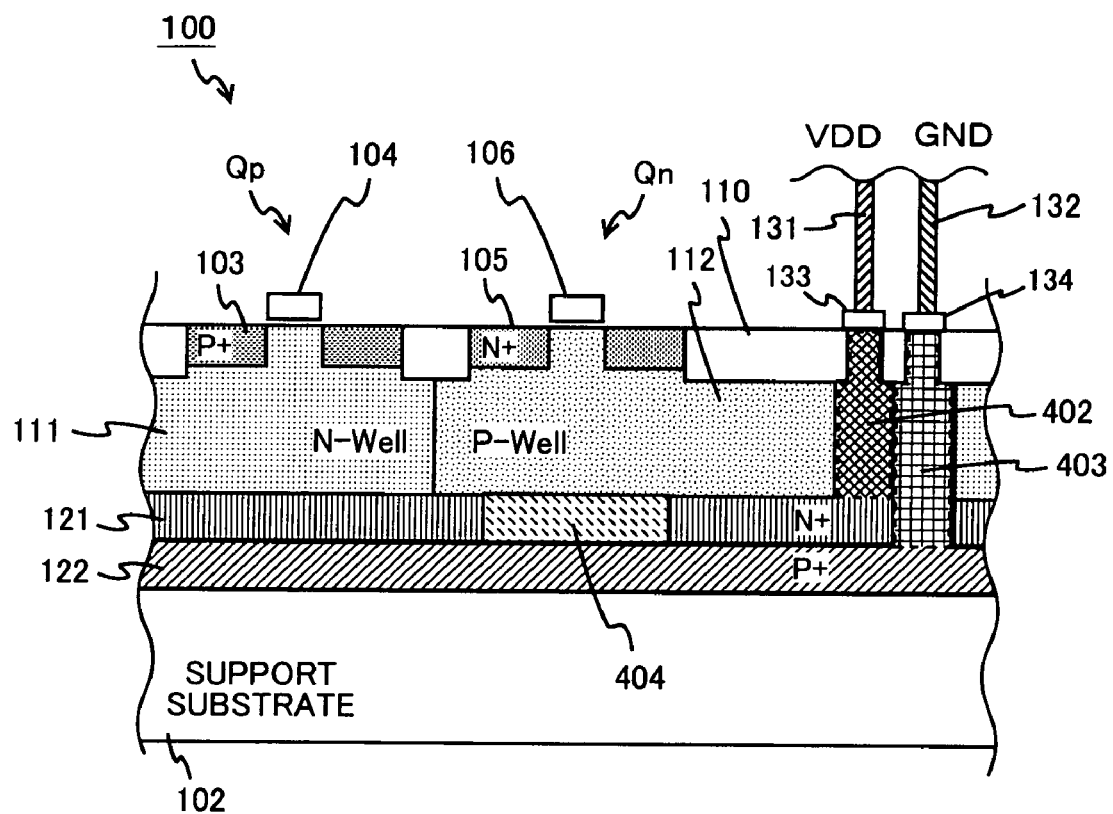
FIG. 21 is a sectional view of a semiconductor integrated device according to another embodiment.

Moreover, as shown in FIG. 21, the N-type tap 123 and the P-type tap 124 may be constituted by metal lines 402, 403. In addition, the P-type contact region 113 may also be constituted by a metal line 404. In this case, the line resistance of the N-type tap 123, the P-type tap 124, and the P-type contact region 113 can be reduced, and thus more accurate well potentials can be supplied to the N-type well 111 and the P-type well 112. Note that the metal lines 402, 403 are electrically insulated from other regions by an insulating layer such as an oxide film except the N-type impurity layer 121 and the P-type impurity layer 122, and that the metal line 404 is also electrically insulated from other regions by an insulating layer such as an oxide film except the P-type well 112 and the P-type impurity layer 122.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A manufacturing method for a semiconductor integrated device, said method comprising:

forming a second impurity layer of a second conductivity type that is higher in an impurity concentration than a second well of the second conductivity type on a first impurity layer of a first conductivity type that is higher in an impurity concentration than an impurity concentration of a first well of the first conductivity type;

forming an impurity region in the second impurity layer, the impurity region having the first conductivity type that is higher in an impurity concentration than the impurity concentration of the first well;

forming the first well of the first conductivity type on the second impurity layer of the second conductivity type formed on the first impurity layer of the first conductivity type, the first well being supplied with a potential from the first impurity layer of the first conductivity type via the impurity region;

forming the second well of the second conductivity type on the second impurity layer of the second conductivity type formed on the first impurity layer of the first conductivity type, the second well being supplied with a potential from the second impurity layer of the second conductivity type; and forming a supply voltage region electrically connecting the second impurity layer and a supply voltage terminal supplying a supply voltage to the second impurity layer, said supply voltage region comprising an opening in the first well that extends from an upper surface of the second impurity layer to an upper surface of the first well.

2. The manufacturing method for the semiconductor integrated device according to claim 1, wherein the first impurity layer of the first conductivity type and the second impurity layer of the second conductivity type are formed by epitaxial growth.

3. The manufacturing method for the semiconductor integrated device according to claim 1, wherein the first impurity layer of the first conductivity type and the second impurity layer of the second conductivity type are formed by ion injection and then heat treatment for impurity diffusion.

4. The manufacturing method for the semiconductor integrated device according to claim 1, further comprising epitaxially growing the second impurity layer on a surface of a semiconductor substrate.

5. The manufacturing method for the semiconductor integrated device according to claim 4, wherein said semiconductor substrate has an impurity concentration lower than the impurity concentration of the second impurity layer.

6. The manufacturing method for the semiconductor integrated device according to claim 4, wherein said semiconductor substrate comprises an insulator.

7. The manufacturing method for the semiconductor integrated device according to claim 4, wherein said semiconductor substrate has the second conductivity type.

8. The manufacturing method for the semiconductor integrated device according to claim 1, further comprising:
  forming another supply voltage region electrically connecting the first impurity layer and another supply voltage terminal supplying another supply voltage to the first impurity layer, said another supply voltage region comprising an opening that extends through one of the first well to the upper surface of first well and said substrate to a lower surface of said substrate.

9. The manufacturing method for the semiconductor integrated device according to claim 8, wherein said another supply voltage region passes through the second impurity layer.

10. The manufacturing method for the semiconductor integrated device according to claim 1, wherein the first well abuts the second well.

* * * * *